United States Patent
Du

(10) Patent No.: US 12,393,746 B2
(45) Date of Patent: Aug. 19, 2025

(54) DRIVING SIMULATION METHOD AND APPARATUS, ELECTRONIC DEVICE, AND COMPUTER STORAGE MEDIUM

(71) Applicant: Tencent Technology (Shenzhen) Company Limited, Shenzhen (CN)

(72) Inventor: Haining Du, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 1076 days.

(21) Appl. No.: 17/371,900

(22) Filed: Jul. 9, 2021

(65) Prior Publication Data
US 2021/0334420 A1    Oct. 28, 2021

Related U.S. Application Data

(63) Continuation of application No. PCT/CN2020/086029, filed on Apr. 22, 2020.

(30) Foreign Application Priority Data

May 5, 2019  (CN) .......................... 201910368409.1

(51) Int. Cl.
G06F 30/15 (2020.01)
G06F 30/10 (2020.01)
G06F 30/20 (2020.01)

(52) U.S. Cl.
CPC .............. *G06F 30/15* (2020.01); *G06F 30/10* (2020.01); *G06F 30/20* (2020.01)

(58) Field of Classification Search
CPC .......... G06F 30/10; G06F 30/15; G06F 30/20; G05D 1/0088; G05D 1/0219; G05D 1/0276

(Continued)

(56) References Cited

U.S. PATENT DOCUMENTS 11,238,674 B2 *  2/2022  Amelunxen ........... G09B 19/14
2017/0161410 A1  6/2017  Mizuta
2018/0297596 A1  10/2018  Li et al.

FOREIGN PATENT DOCUMENTS

CN     102622516 A    8/2012
CN     102779357 A    11/2012
(Continued)

OTHER PUBLICATIONS

Yuming Zhang, Force-Driven Traffic Simulation for a Future Connected Autonomous Vehicle-Enabled Smart Transportation System (Year:Jul. 2018).*

(Continued)

*Primary Examiner* — John E Johansen
(74) *Attorney, Agent, or Firm* — Morgan, Lewis & Bockius LLP

(57) ABSTRACT

This application discloses a driving simulation method performed at an electronic device. The method includes: receiving parameters through a first configuration interface; determining, based on the parameters, a reference vehicle-to-vehicle distance, a reference vehicle speed, and a background vehicle quantity of a target lane; determining an initial location of each of background vehicles in the target lane based on a location of a test vehicle, the reference vehicle-to-vehicle distance, and a random distance deviation; determining an initial speed of each of the background vehicles in the target lane based on the reference vehicle speed and a random speed deviation; and simulating traveling of each of the background vehicles in a simulated traffic environment based on the initial location and the initial speed of each of the background vehicles and the background vehicle quantity.

19 Claims, 12 Drawing Sheets

(58) Field of Classification Search
USPC .......................................................... 703/8
See application file for complete search history.

(56) References Cited

FOREIGN PATENT DOCUMENTS

| CN | 102999646 A | 3/2013 |
|---|---|---|
| CN | 105930565 A | 9/2016 |
| CN | 107230364 A | 10/2017 |
| CN | 108762889 A | 11/2018 |
| CN | 110069887 A | 7/2019 |

OTHER PUBLICATIONS

Joaquín Maroto, Real-Time Traffic Simulation With a Microscopic Model (Year: Dec. 2006).*
Anonymous, Wikipedia—Traffic Flow (Year: Apr. 8, 2019).*
Mohamed said El Hmam, Macro-Micro Simulation of Traffic Flow (Year: 2006).*
Yuming Zhang, Force-Driven Traffic Simulation for a Future Connected Autonomous Vehicle-Enabled Smart Transportation System (Year:Jul. 2018) (Year: 2018).*
Johan Janson Olstam, A model for simulation and generation of surrounding vehicles in driving simulators (Year: 2005).*
Joaquín Maroto, Real-Time Traffic Simulation With a Microscopic Model (Year: Dec. 2006) (Year: 2006).*
Anonymous, Wikipedia—Traffic Flow (Year: Apr. 8, 2019) (Year: 2019).*
Tencent Technology, WO, PCT/CN2020/086029, Jul. 23, 2020, 6 pgs.
Tencent Technology, IPRP, PCT/CN2020/086029, Nov. 2, 2021, 7 pgs.
Tencent Technology, EP Office Action, European Patent Application No. 20802483.6, Nov. 14, 2022, 5 pgs.
Anonymous: "Traffic flow—Wikipedia", Apr. 8, 2019, XP55881170, 41 pgs., Retrieved from the Internet: https://en.wikipedia.org/w/index.php?title=%20Traffic flowkoldid=891534116.
Extended European Search Report, EP20802483.6, Feb. 4, 2022, 10 pgs.
Seongjin Choi et al., "Framework for Simulation-based Lane Change Control for Autonomous Vehicles", 2017 IEEE Intelligent Vehicles Symposium (IV), Jun. 11, 2017, XP033133830, 6 pgs.
Yuming Zhang et al., "Force-Driven Traffic Simulation for a Future Connected Autonomous Vehicle-Enabled Smart Transportation System", IEEE Transactions on Intelligent Transportation Systems, Piscataway, NJ, vol. 19, No. 7, Jul. 1, 2018, XP011686287, 13 pgs.
Tencent Technology, ISR, PCT/CN2020/086029, Jul. 23, 2020, 2 pgs.

* cited by examiner

DRIVING SIMULATION METHOD AND APPARATUS, ELECTRONIC DEVICE, AND COMPUTER STORAGE MEDIUM

CROSS-REFERENCE TO RELATED APPLICATIONS

This application is a continuation application of PCT Patent Application No. PCT/CN2020/086029, entitled "DRIVING SIMULATION METHOD AND APPARATUS, ELECTRONIC DEVICE AND COMPUTER STORAGE MEDIUM" filed on Apr. 22, 2020, which claims priority to Chinese Patent Application No. 201910368409.1, filed with the State Intellectual Property Office of the People's Republic of China on May 5, 2019, and entitled "DRIVING SIMULATION METHOD, DEVICE AND EQUIPMENT AND STORAGE MEDIUM", all of which are incorporated herein by reference in their entirety.

FIELD OF THE TECHNOLOGY

This application relates to the technical field of autonomous driving, and in particular, to a driving simulation method and apparatus, an electronic device, and a computer-readable storage medium.

BACKGROUND OF THE DISCLOSURE

An autonomous vehicle is a smart car that realizes unmanned driving through a computer system, which can bring people benefits such as reducing traffic accidents, saving energy, and allowing people to have more free time, and is a development trend of the vehicle in future.

The driving of an autonomous vehicle is controlled by a decision algorithm. In order to test the decision algorithm, a simulated traffic environment needs to be built. A test vehicle controlled by the decision algorithm travels in the simulated traffic environment. The decision algorithm is evaluated by observing and recording the driving state of the test vehicle.

In order to cause the simulated driving environment to restore the real driving environment as much as possible, the simulated driving environment always needs several background vehicles, and the background vehicles need to travel in different ways.

SUMMARY

Embodiments of this application provides a driving simulation method and apparatus, an electronic device, and a computer-readable storage medium, which can effectively improve the efficiency and accuracy of building a simulated traffic environment.

An embodiment of this application provides a driving simulation method, performed by an electronic device, the method including:
  receiving parameters through a first configuration interface;
  determining, based on the parameters, a reference vehicle-to-vehicle distance, a reference vehicle speed, and a background vehicle quantity of a target lane, the target lane including a lane in which a test vehicle and background vehicles are located;
  determining an initial location of each of the background vehicles in the target lane based on a location of the test vehicle, the reference vehicle-to-vehicle distance, and a random distance deviation;
  determining an initial speed of each of the background vehicles in the target lane based on the reference vehicle speed and a random speed deviation; and
  simulating traveling of each of the background vehicles in a simulated traffic environment based on the initial location and the initial speed of each of the background vehicles and the background vehicle quantity.

An embodiment of this application provides a driving simulation method, performed by a server, the server including one or more processors, a memory, and one or more programs, the one or more programs being stored in the memory, the program including one or more units each corresponding to a set of instructions, the one or more processors being configured to execute the instructions; the method including:
  receiving parameters through a first configuration interface;
  determining, based on the parameters, a reference vehicle-to-vehicle distance, a reference vehicle speed, and a background vehicle quantity of a target lane, the target lane including a lane in which a test vehicle and background vehicles are located;
  determining an initial location of each of the background vehicles in the target lane based on a location of the test vehicle, the reference vehicle-to-vehicle distance, and a random distance deviation;
  determining an initial speed of each of the background vehicles in the target lane based on the reference vehicle speed and a random speed deviation; and
  simulating traveling of each of the background vehicles in a simulated traffic environment based on the initial location and the initial speed of each of the background vehicles and the background vehicle quantity.

An embodiment of this application provides a driving simulation apparatus, including:
  a first interaction module, configured to receive parameters through a first configuration interface;
  a parameter determination module, configured to determine, based on the parameters, a reference vehicle-to-vehicle distance, a reference vehicle speed, and a background vehicle quantity of a target lane, the target lane including a lane in which a test vehicle and background vehicles are located;
  a background vehicle generation module, configured to determine an initial location of each of the background vehicles in the target lane based on a location of the test vehicle, the reference vehicle-to-vehicle distance, and a random distance deviation, and determine an initial speed of each of the background vehicles in the target lane based on the reference vehicle speed and a random speed deviation; and
  a simulation control module, configured to simulate traveling of each of the background vehicles in a simulated traffic environment based on the initial location and the initial speed of each of the background vehicles and the background vehicle quantity.

An embodiment of this application provides an electronic device, including a processor and a memory,
  the memory being configured to store a plurality of computer programs; and
  the processor being configured to perform the foregoing driving simulation method according to the computer programs.

An embodiment of this application provides a non-transitory computer-readable storage medium, storing a plurality of computer programs that, when executed by a processor of an electronic device, implement the foregoing driving simulation method.

An embodiment of this application provides a computer program product including instructions, the instructions, when run on a computer, causing the computer to perform the foregoing driving simulation method.

As can be seen from the foregoing technical solution, the embodiments of this application have the following advantages:

An embodiment of this application provides a driving simulation method. When users build a simulated traffic environment based on the method, only a small number of basic parameters need to be configured at one time through the first configuration interface to complete settings of the background vehicles in the simulated traffic environment, which can effectively reduce manual operations required during building of the simulated traffic environment, thus improving the efficiency of building the simulated traffic environment. In addition, the reference vehicle-to-vehicle distance and the reference vehicle speed are respectively adjusted according to the random distance deviation and the random speed deviation, to ensure that the set driving states of the background vehicles are diverse and random, thus effectively improving the accuracy of the simulated traffic environment and meeting basic requirements for traffic simulation.

DESCRIPTION OF EMBODIMENTS

To make persons skilled in the art understand solutions of this application better, the following clearly and completely describes the technical solutions in the embodiments of this application with reference to the accompanying drawings in the embodiments of this application. Apparently, the described embodiments are merely some but not all of the embodiments of this application. All other embodiments obtained by a person of ordinary skill in the art based on the embodiments of this application without creative efforts shall fall within the protection scope of this application.

In this specification, the claims, and the accompanying drawings of this application, the terms "first", "second", and so on are intended to distinguish similar objects but do not necessarily indicate a specific order or sequence. It is to be understood that the data termed in such a way are interchangeable in appropriate circumstances, so that the embodiments of this application described herein can be implemented in orders other than the order illustrated or described herein. Moreover, the terms "include", "contain" and any other variants mean to cover the non-exclusive inclusion, for example, a process, method, system, product, or device that includes a list of steps or units is not necessarily limited to those expressly listed steps or units, but may include other steps or units not expressly listed or inherent to such a process, method, system, product, or device.

For ease of understanding the technical solutions provided in the embodiments of this application, an application scenario to which the driving simulation method provided in the embodiments of this application is applicable is described below. The driving simulation method provided in the embodiments of this application can be implemented by software, for example, simulation software for autonomous driving simulation. The simulation software can be deployed in a terminal device or a server, which is to be described respectively below.

Figure 1A:
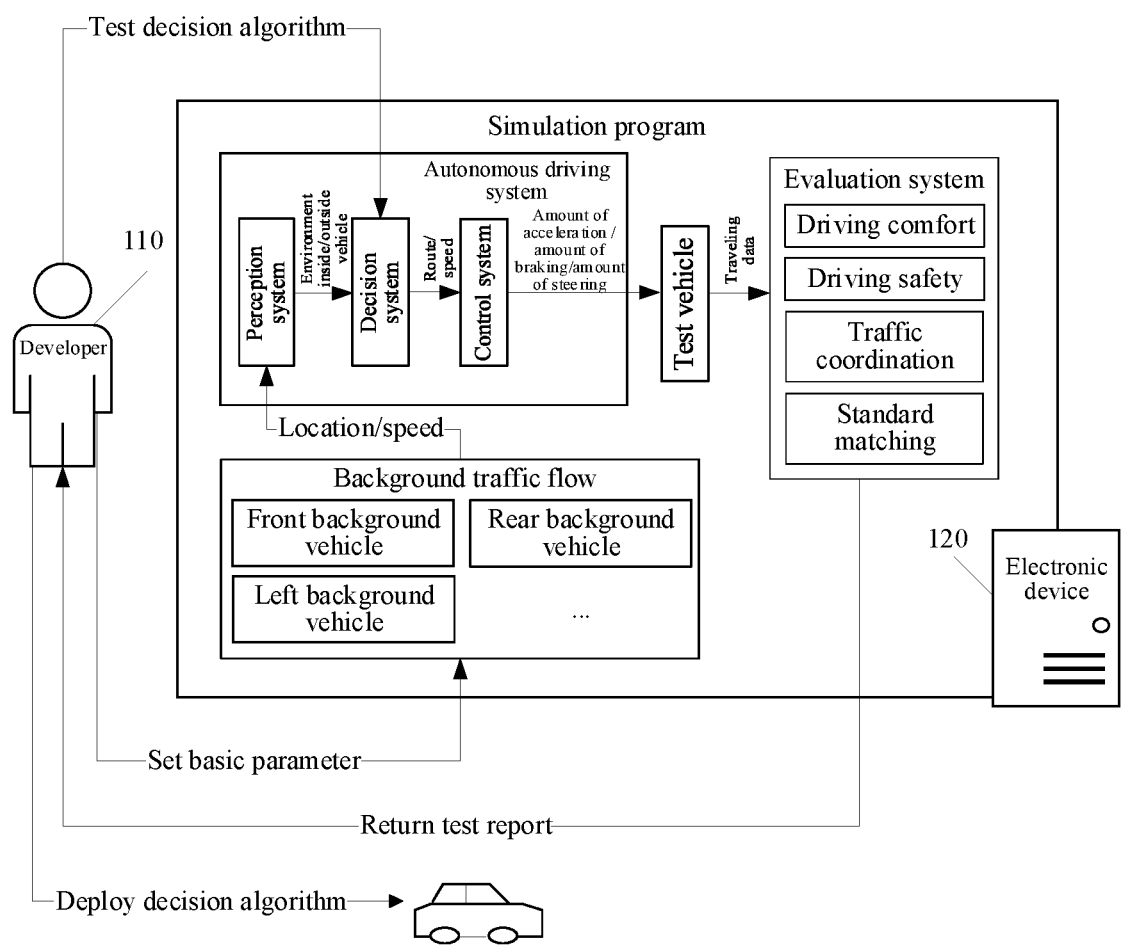
FIG. 1A to FIG. 1C are schematic diagrams of application scenarios of a driving simulation method according to an embodiment of this application.

FIG. 1A is a schematic diagram of an application scenario of a driving simulation method according to an embodiment of this application. As shown in FIG. 1A, the application scenario includes a developer 110 and an electronic device 120. The electronic device 120 can run a simulation program.

After the developer 110 inputs basic parameters used for setting background vehicles in a simulated traffic environment, the electronic device 120 sets the background vehicles (a background traffic flow) that matches the set basic parameters in the simulation program, for example, a front background vehicle and a rear background vehicle. The background vehicles travel on a road according to predefined driving behaviors (an initial location and an initial speed) to perform a decision algorithm during subsequent verification and test of vehicles traveling in the traffic flow. During traveling of the background vehicles on the road, a perception system in an autonomous driving system of the vehicle is tested to sense environment information inside and outside the vehicle is sensed, including locations, speeds, orientations, and object classification of obstacles in the environment (such as vehicles, pedestrians, bicycles), as well as its own state (including a speed, acceleration, and a direction) of the test vehicle and a high-precision map of a real-time location of the test vehicle.

After the environmental information inside and outside the vehicle is obtained, the decision system determines a driving route and speed of the test vehicle according to the decision algorithm of the test vehicle. The test vehicle predicts perceived obstacles (including background vehicles) based on the simulated traffic environment, objective physical laws, and accumulated historical data knowledge by using its own decision algorithm during traveling, so as to make macroscopic decisions; predicts the move direction of the background vehicle within a period of time and speed changes during the movement, may further use the decision algorithm to make road selection and lane selection and determine whether to normally follow obstacles (such as people, cars, etc.) on the road, whether to bypass obstacles (such as people, cars, etc.), whether to stop, whether to wait and avoid in front of traffic lights and pedestrians, and interaction with other vehicles at intersections, may further plan an ideal route based on the environmental perception information, including selecting route points of the route, as well as the speed, orientation, and acceleration of the vehicle when reaching each route point, so as to ensure that the test vehicle can travel safely.

After determining the driving route and speed of the test vehicle, the decision system transmits the driving route and speed to a control system. After receiving the driving route and speed, the control system performs dynamic calculations based on attributes of the vehicle body and external physical factors, and converts the attributes and the external physical factors to vehicle control parameters such as an amount of acceleration, an amount of braking, and an amount of steering of a steering wheel for electronic control on the test vehicle, so as to control the vehicle to travel on the driving route.

Through verification of the decision algorithm of the test vehicle traveling in the traffic flow through the above autonomous driving system, driving data of the test vehicle is recorded, and the driving data of the test vehicle is evaluated through the autonomous driving evaluation system to obtain evaluation data (a test report) of the test vehicle. The driving data includes all subtle performance of the test vehicle after starting from the starting point, for example, whether the test vehicle runs a red light, runs on full lines, whether a collision occurs, whether the test vehicle reaches the end, a state of an accelerator, a braking state, a steering state, and the like. According to the driving data of the test vehicle, driving safety of the decision algorithm is evaluated (a traveling decision and behaviors of the vehicle on the road), for example, it is determined that the driving safety of the decision algorithm is low according to fatal errors in the driving data, memory leaks, data delay, traffic accidents, and the like. According to the driving data of the test vehicle, driving comfort of the decision algorithm (the driving experience of a driver or a passenger while the vehicle is traveling on the road) is evaluated, for example, it is evaluated, according to the accelerator, the brake, and the steering state in the driving data, whether the test vehicle is traveling smoothly and turning smoothly, so as to determine the driving comfort. According to the driving data of the test vehicle, traffic coordination of the decision algorithm (traffic movement performance of the vehicle relative to other background vehicles when the vehicle is traveling on the road) and the standard matching (autonomous driving behaviors according to laws and regulations of different countries) are evaluated. The test report is used as a reference for developers to continuously improve the decision algorithm, so that the decision algorithm has good performance when being deployed on an autonomous vehicle.

During implementation of the embodiments of this application, it is found that in the development process of autonomous vehicles, it is necessary to use an autonomous driving simulation test system to test and verify the developed decision algorithm. However, during testing and verification, if a simulated traffic environment is artificially built, that is, a number of background vehicles are manually set around the test vehicle, and the driving behavior of the background vehicle is set, during the simulation operation, the background vehicle travels on the road based on the predefined driving behavior to verify the decision algorithm of the test vehicle traveling in the traffic flow. As a result, when the user builds the simulated traffic environment, a large number of background vehicle parameters need to be configured to complete the setting of the background vehicles in the simulated traffic environment, resulting in low efficiency of building the simulated traffic environment.

Figure 1B:
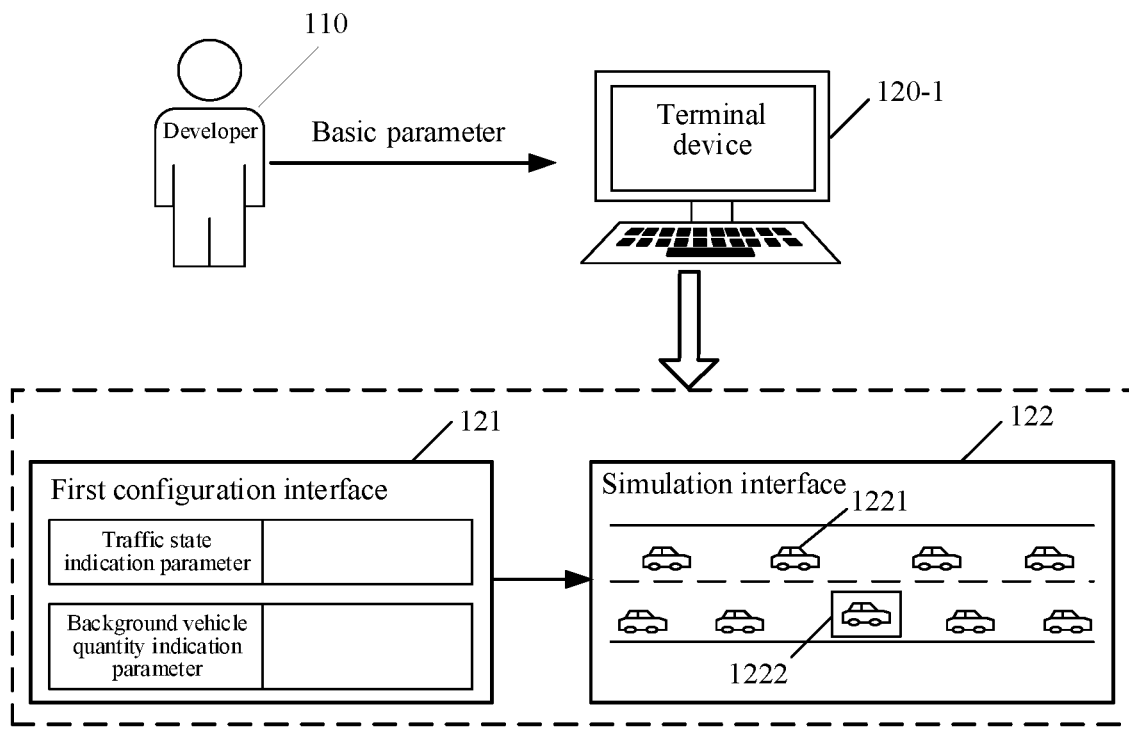

In order to solve the above problems, the electronic device 120 performs the driving simulation method provided by the embodiment of the present disclosure, which serves as an example of an application scenario of simulation of running of the terminal device (the electronic device 120). FIG. 1B is a schematic diagram of an application scenario of a driving simulation method according to an embodiment of this application. As shown in FIG. 1B, the application scenario includes a developer 110 and an electronic device 120-1. The terminal device 120-1 can run a simulation program. The developer 110 can input, through a first configuration interface 121 displayed on the terminal device 120-1, the basic parameters of the background vehicle set by the developer in the simulated traffic environment. The terminal device 120-1 is configured to perform the driving simulation method provided by the embodiment of this application, and set background vehicles matching the set basic parameters in the simulated traffic environment. The background vehicle travels on the road according to predefined driving behaviors to verify the decision algorithm of the test vehicle traveling in the traffic flow through the autonomous driving system, and obtain the evaluation data of the test vehicle through the evaluation system to implement the simulation of the traffic environment of the test vehicle. When the developer 110 needs to use the simulated traffic environment to test the decision algorithm of the test vehicle, the developer 110 may invoke a simulation program running on the terminal device 120-1 to build a simulated traffic environment. In building of the simulated traffic environment, the terminal device 120-1 (for example, a simulation program run by the terminal device 120) will correspondingly display the first configuration interface 121, the first configuration interface 121 carrying a number of configuration controls configured to input the basic parameters. As shown in FIG. 1B, the first configuration interface 121 may carry a configuration control configured to input a traffic state indication parameter and a configuration control configured to input a background vehicle quantity indication parameter.

The developer 110 correspondingly inputs the basic parameters used for setting the background vehicles through the configuration controls displayed on the first configuration interface 121. After receiving the basic parameters inputted by the user, the terminal device 120-1 may determine, according to the basic parameters, a reference vehicle-to-vehicle distance, a reference vehicle speed, and N (N is a positive integer) target background vehicle speeds of a target lane. Further, the terminal device 120-1 sequentially determines an initial location of an $i^{th}$ background vehicle in the target lane according to a location of the test vehicle, the reference vehicle-to-vehicle distance, and a random distance deviation, and sequentially determines an initial speed of the $i^{th}$ background vehicle in the target lane according to the reference vehicle speed and a random speed deviation, a value for i being in a range of 1 to N.

In this way, after the terminal device 120-1 determines the respective initial locations and initial speeds corresponding to the N background vehicles in the above manner, according to the respective initial locations and initial speeds corresponding to the background vehicles, the background vehicles travel on the road according to respective initial locations and initial speeds, and the test vehicle is started to test the decision algorithm of the test vehicle.

The autonomous driving simulation interface may be specifically shown in a simulation interface 122 in FIG. 1B. A vehicle surrounded by a rectangular frame on the simulation interface 122 is a test vehicle 1221. The decision algorithm to be tested in the simulation process runs on the test vehicle 1221. Other vehicles on the simulation interface 122 that are not surrounded by the rectangular frame on the simulation interface 122 are the background vehicles generated based on the above method, for example, the background vehicles 1222. The background vehicles travel on a target road according to predefined driving behaviors, and certain driving behaviors produced by the background vehicles will affect the driving decision behavior of the test vehicle, so as to verify the decision algorithm operating on the test vehicle.

In order to prevent the background vehicles from gradually pulling out of the effective test range due to the lack of speed constraints on the background vehicles, a background vehicle quantity around the test vehicle is reduced, and the decision algorithm cannot be effectively verified. During the simulation of the terminal device 120-1, the speed of the background vehicle at the front may be constant, and speeds of other background vehicles are updated accordingly according to following models (during the simulation, a vehicle fleet consisting of the test vehicle and the background vehicles will travel in a direction of the target road together, and the traveling law can usually follow the following models). In this way, speed constraints are imposed on the background vehicles in the simulated traffic environment.

It is to be understood that the application scenario shown in FIG. 1B is merely an example. In actual application, in addition to the autonomous driving simulation based on the terminal device 120-1 shown in FIG. 1B, the autonomous driving simulation may further be performed based on other types of terminal devices. In addition, the first configuration interface 121 and the simulation interface 122 shown in FIG. 1B are only examples. In actual application, the first configuration interface and the simulation interface may also be expressed in other forms. The application scenarios of the driving simulation method provided in the embodiments of this application are not limited herein.

Figure 1C:
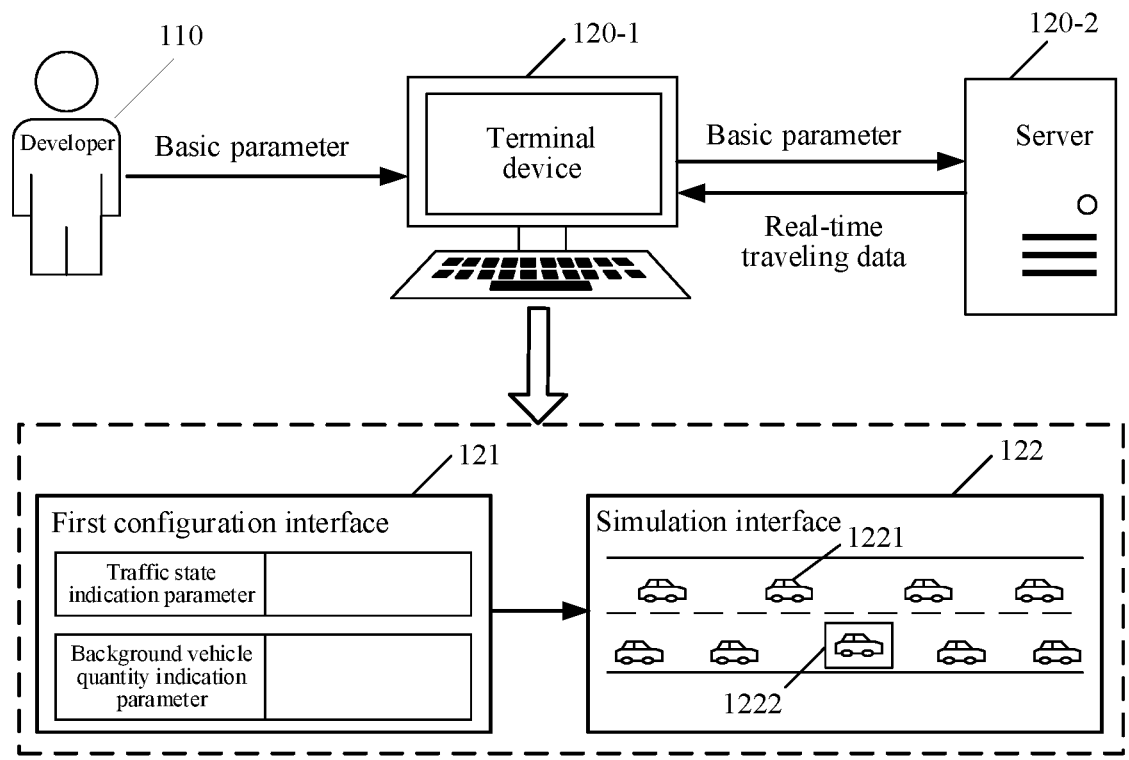

As an example of an application scenario for running a simulation program as the server 120-2 (the electronic device 120). FIG. 1C is a schematic diagram of an application scenario of a driving simulation method according to an embodiment of this application. As shown in FIG. 1C, the application scenario includes a user 110, a terminal 120-1, and a server 120-2. The server 120-2 can run the simulation program.

The user 110 may input basic parameters for setting the background vehicles in the simulated traffic environment through the first configuration interface 121 displayed on the terminal 120-1, and the terminal 120-1 transmits the basic parameters for setting the background vehicles and the decision algorithm to the server 120-2 in the cloud. The server 120-2 determines the reference vehicle-to-vehicle distance, the reference vehicle speed, and speeds of N (N is a positive integer) target background vehicles in the target lane according to the basic parameters of the background vehicles. Further, the server 120-2 determines initial locations of the background vehicles in the target lane according to a location of the test vehicle, the reference vehicle-to-vehicle distance, and a random distance deviation, and determines initial speeds of the background vehicles in the target lane according to the reference vehicle speed and a random speed deviation. The background vehicle travels on the road according to the predefined driving behavior (the initial speed and location of the background vehicle) to verify the decision algorithm of the test vehicle traveling in the traffic flow through the autonomous driving system and to obtain evaluation data of the test vehicle through the evaluation system. During the running of the decision algorithm, the server 120-2 may further synchronize the real-time driving data of the simulation environment to the terminal device. The terminal device displays the driving process of the test vehicle running the decision algorithm on the simulation interface 122 according to the real-time driving data.

Based on the above, in view of the problems of low efficiency in building a simulated traffic environment and cumbersome operation due to the need for developers to manually set the background vehicles in the simulated traffic environment one by one, the embodiments of this application provide a driving simulation method, which can effectively simplify the manual operations that developers need to perform, and improve the efficiency of building the simulated traffic environment.

For example, in the driving simulation method provided in the embodiment of this application, the basic parameters inputted by the developer through the first configuration interface are first received, then the reference vehicle-to-vehicle distance, the reference vehicle speed, and a target background vehicle quantity of the target lane are determined according to the basic parameters inputted by the developer, and then the initial location of each of the background vehicles in the target lane is sequentially determined according to a location of the test vehicle, the reference vehicle-to-vehicle distance, and a random distance deviation, and the initial speed of each of the background vehicles in the target lane is sequentially determined according to the reference vehicle speed and a random speed deviation. In this way, after the respective initial speed and initial location of each of the background vehicles in the target lane are determined, the autonomous driving simulation is performed on this basis.

Compared with the developer manually setting the background vehicles one by one in the simulated traffic environment, the method provided in the embodiment of this application only requires the developer to input a small number of basic parameters through the first configuration interface to complete the setting of the background vehicles in the simulated traffic environment, which greatly simplifies the operations that developers need to perform, and improves the efficiency of building a simulated traffic environment. In addition, the method provided in the embodiments of this application also considers the random speed deviation and the random location deviations in the process of setting the background vehicles, thereby ensuring the diversity and randomness of traveling states of the set background vehicles, so that the simulated traffic environment is more realistic.

It is to be understood that the driving simulation method provided in the embodiments of this application may be applied to an electronic device with a simulation function. The electronic device may be a terminal device. The terminal device may specifically be a computer, a personal digital assistant (PDA), a tablet computer, a smart phone, and the like. The electronic device may specifically be a server, a server cluster, and the like. The server may provide simulation services based on the cloud technology for use by the developer of the decision algorithm.

The driving simulation method provided in this application is described below.

Figure 2:
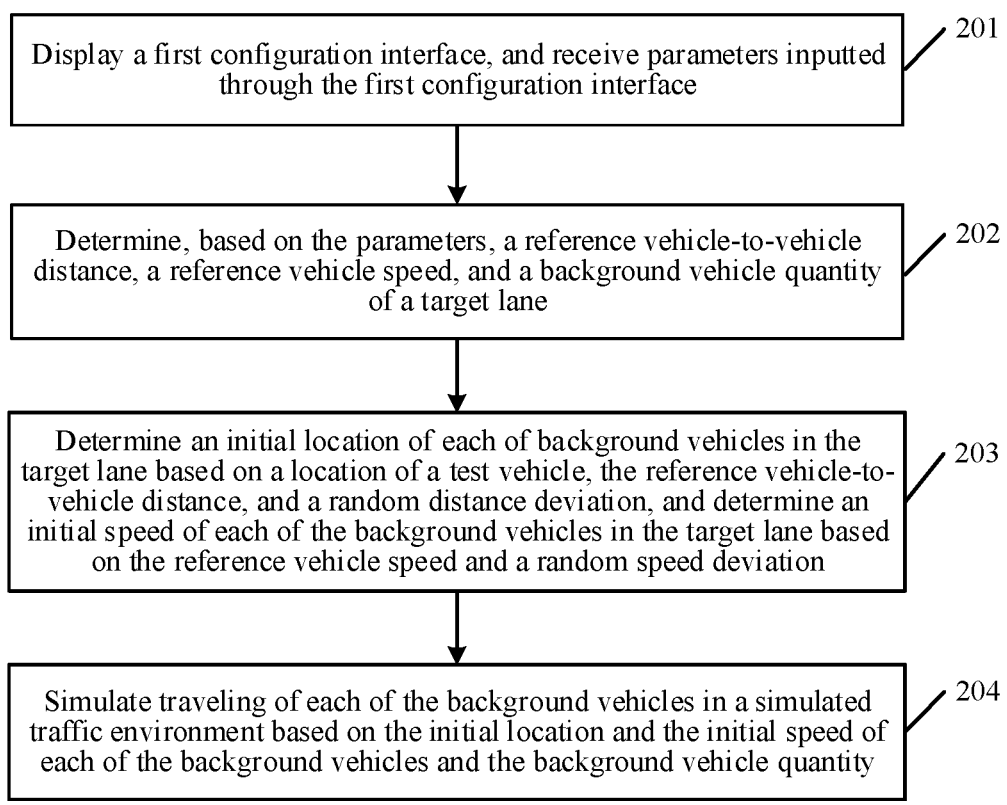
FIG. 2 is a schematic flowchart of a driving simulation method according to an embodiment of this application.

FIG. 2 is a schematic flowchart of a driving simulation method according to an embodiment of this application. For ease of description, the following embodiments are described with the method performed by a terminal device. For example, a simulation program running in the terminal device is used for performing the method by way of example for description. As shown in FIG. 2, the driving simulation method includes the following steps.

Step 201: Display a first configuration interface, and receive parameters inputted through the first configuration interface.

When a user needs to build a simulated traffic environment and use the simulated traffic environment to verify the decision algorithm of the test vehicle, the user may call simulation software carried on the terminal device for simulating the traffic environment. After the simulation software is called, the first configuration interface is to be displayed to the user, and the user can correspondingly input, through the first configuration interface according to actual requirements for the simulation, the basic parameters for setting the background vehicle in the simulated traffic environment.

In order to facilitate the understanding of the above first configuration interface and the basic parameters inputted through the first configuration interface, the following introduces two exemplary manifestations of the first configuration interface, and correspondingly introduces the basic parameters received through the first configuration interface.

In some implementations, the first configuration interface may carry a configuration control configured to configure a traffic state indication parameter and a configuration control configured to configure a background vehicle quantity indication parameter. Accordingly, the terminal device may receive, through the first configuration interface, the target traffic state indication parameter and the target background vehicle quantity indication parameter inputted by the user.

The traffic state indication parameter is a parameter that can indicate the traffic state in the simulated traffic environment, for example, a traffic capacity, a traffic density, a background vehicle driving speed in the simulated traffic environment, and the like. The terminal device can set the target traffic state corresponding to the target traffic state indication parameter in the simulated traffic environment according to the target traffic state indication parameter after receiving, through the configuration control configured to configure the traffic state indication parameter on the first configuration interface, the target traffic state indication parameter inputted by the user.

In some embodiments, the configuration control configured to configure a traffic state indication parameter may be a configuration control configured to configure a traffic density. Accordingly, the traffic density received by the terminal device through the configuration control is a target traffic density. The traffic density is a parameter used for characterizing the density of vehicles on the road, which is usually in units of vehicles/kilometer.

In some embodiments, the configuration control configured to configure a traffic state indication parameter may include: a configuration control configured to configure a traffic capacity and a configuration control configured to configure a vehicle speed. Correspondingly, the traffic capacity received by the terminal device through the configuration control configured to configure the traffic capacity is the target traffic capacity, and the vehicle speed received by the terminal device through the configuration control configured to configure the vehicle speed is a target vehicle speed. The traffic capacity is a parameter used for characterizing the traffic flow on the road, which is usually in units of vehicles/hour. The vehicle speed is used for characterizing basic traveling speeds of the background vehicles on the road, and the initial speeds of the background vehicles are determined based on the basic traveling speed, which is usually in units of kilometers/hour.

It is to be understood that, in addition to the traffic density, the traffic capacity, and the vehicle speed, the traffic state indication parameter may also be other reference data that can be used for setting the traffic state in a simulated traffic environment. The traffic state indication parameter is not limited herein.

The background vehicle quantity indication parameter is basic data used for determining the background vehicle quantity in the simulated traffic environment. After receiving the target background vehicle quantity indication parameter inputted by the user through the configuration control configured to configure the background vehicle quantity indication parameter on the first configuration interface, the terminal device may determine a quantity of background vehicles required in the simulation process according to the target background vehicle quantity indication parameter.

In some embodiments, the configuration control configured to configure the background vehicle quantity indication parameter may be a configuration control configured to configure the background vehicle quantity parameter. Accordingly, the background vehicle quantity received by the terminal device through the configuration control is a target background vehicle quantity. The background vehicle quantity can directly indicate the quantity of background vehicles that need to be set in the target lane in the simulated traffic environment.

For example, when there is only one target lane in the simulated traffic environment to be built, the quantity of background vehicles that need to be set in the target lane may be directly configured through the configuration control configured to configure the background vehicle quantity parameter on the first configuration interface. When there are a plurality of target lanes in the simulated traffic environment to be built, a quantity M of background vehicles that need to be set in total in the simulated traffic environment and a quantity S of target lanes are configured through the configuration control configured to configure the background vehicle quantity parameter on the first configuration interface. Further, the quantity of background vehicles that need to be set in each target lane is determined according to a value obtained by dividing M by S.

In some embodiments, the configuration control configured to configure the background vehicle quantity indication parameter may be a configuration control configured to configure a location range indication parameter. Accordingly, the location range indication parameter received by the terminal device through the configuration control is a target location range indication parameter. The location range indication parameter can indicate a setting range of the background vehicle in the simulated traffic environment. The location range is combined with vehicle distances, so that the quantity of background vehicles that need to be set in the target lane in the simulated traffic environment can be determined.

It is to be understood that in addition to the background vehicle quantity parameter and the location range indication parameter, the background vehicle quantity indication parameter may further be other reference data that can determine the background vehicle quantity in the simulated traffic environment. No limitation is imposed on the background vehicle quantity indication parameter herein.

In another implementation, the first configuration interface can carry the configuration control configured to configure the reference vehicle-to-vehicle distance, the configuration control configured to configure the reference vehicle speed, and the configuration control configured to configure the target background vehicle quantity in the target lane. Accordingly, the terminal device may receive the following basic parameters through the first configuration interface: the reference vehicle-to-vehicle distance, the reference vehicle speed, and the target background vehicle quantity in the target lane.

The reference vehicle-to-vehicle distance is a distance between two adjacent vehicles on the same lane in the simulated traffic environment. The reference vehicle speed is the same concept as the vehicle speed mentioned above, that is, the reference vehicle speed is used for characterizing basic traveling speeds of the background vehicles on the road, and the initial speeds of the background vehicles are determined based on the basic traveling speeds.

Under normal circumstances, the terminal device can accordingly determine the quantity of background vehicles that need to be deployed in the simulated traffic environment according to the target background vehicle quantity when the reference vehicle-to-vehicle distance, the reference vehicle speed, and the target background vehicle quantity are known, and set the initial location and the initial speed corresponding to each of the background vehicles in the simulated traffic environment according to the reference vehicle-to-vehicle distance and the reference vehicle speed. In this way, the initial state data corresponding to each of the background vehicles in the simulated traffic environment is determined to implement the deployment of the background vehicles. It is to be understood that the first configuration interface may not only be configured to configure the reference vehicle-to-vehicle distance, the reference vehicle speed, and the target background vehicle quantity in the target lane, but also may be configured to configure other parameters that can determine an initial deployment state of each of the background vehicles in the simulated traffic environment. No limitation is imposed on the types of parameters that can be configured in the first configuration interface herein.

In some cases, in order to make the simulated traffic environment built more realistic, a variety of different types of background vehicles may be usually set in the simulated traffic environment according to actual needs of users. For example, a minibus, a large bus, a minivan, a large truck, etc. may be simultaneously set as background vehicles in a simulated traffic environment. In this case, the terminal device may obtain the types of background vehicles and proportions of various types of background vehicles in all of the background vehicles through the first configuration interface. The background vehicle quantity directly obtained by the terminal device through the first configuration interface or the background vehicle quantity determined according to the location range indication parameter and the traffic density usually corresponds to the standard vehicle type. For example, assuming that a minibus is used as a standard vehicle type, the background vehicle quantity obtained by the terminal device through the first configuration interface is 50, which indicates that when all of the background vehicles in the simulated traffic environment are minibuses, there are 50 background vehicles in the simulated traffic environment. In view of the above application scenario in which a variety of different types of background vehicles need to be set in the simulated traffic environment, the terminal device further needs to determine the quantity each corresponding to various types of background vehicles in the simulated traffic environment according to the respective proportions of various types of background vehicles set by the user and conversion coefficients between various car models and standard car models when the background vehicle quantity is determined, so that the simulated traffic environment is more realistic.

For example, assuming that the standard vehicle is a minibus, the terminal device determines, according to the basic parameters received through the first configuration interface, that the background vehicle quantity included in the simulated traffic environment is 100 (that is, when the background vehicles included in the simulated traffic environment are all minibuses, the quantity of background vehicles is 100), and the simulated traffic environment includes minibuses and large buses with a ratio of 1:1. In this case, according to the ratio of minibuses and large buses, it may be determined that 50 of the background vehicles need to be converted to minibuses, and the remaining 50 background vehicles are converted to large buses. Since the minibus itself is a standard model, it may be directly determined that 50 minibuses need to be set in the simulated traffic environment. According to a conversion coefficient table pre-stored in the terminal device, a conversion coefficient of large buses to minibuses is determined to be 2 (that is, 1 large bus is equivalent to 2 minibuses), then 50 background vehicles may be converted to 25 large buses, that is, it is determined that 25 large buses need to be set in the simulated traffic environment.

It is to be understood that, in actual application, in addition to the minibus as the standard vehicle type, other types of vehicles may also be used as the standard vehicle type, and no limitation is imposed on the standard vehicle type herein. In addition, the conversion coefficients between various vehicle models can be set according to actual needs, and no limitation is imposed on the conversion coefficients between various vehicle models.

In practical application, the target traffic density, the target traffic capacity and the like received by the terminal device through the first configuration interface usually correspond to the standard vehicle type.

Step 202: Determine, based on the parameters, a reference vehicle-to-vehicle distance, a reference vehicle speed, and a background vehicle quantity of a target lane.

After receiving, through the first configuration interface, the basic parameters inputted by the user, the terminal device may accordingly determine parameters for setting the background vehicles in the simulated traffic environment according to the basic parameters, the parameters including the reference vehicle-to-vehicle distance, the reference vehicle speed, and N (N is a positive integer) target background vehicle quantities of the target lane.

The reference vehicle-to-vehicle distance is a distance between two adjacent vehicles in the target lane in the simulated traffic environment (a distance between two vehicles in the front and rear). The reference vehicle-to-vehicle distance may be a distance between heads of two adjacent vehicles, or may be the distance between rears of two adjacent vehicles. The initial distance between two adjacent vehicles in the target lane is determined based on the reference vehicle-to-vehicle distance. The reference vehicle speed is used for characterizing basic traveling speeds of the background vehicles, and the initial speeds of the background vehicles are determined based on the reference vehicle speed.

When the basic parameters received by the terminal device through the first configuration interface include the target traffic state indication parameter and the target background vehicle indication parameter, the terminal device may determine the reference vehicle-to-vehicle distance and the reference vehicle speed according to the target traffic flow macroscopic fundamental diagram and the target traffic state indication parameter, and determine the target background vehicle quantity in the target lane according to the target background vehicle quantity indication parameter of the target lane.

The traffic flow macroscopic fundamental diagram can describe a relationship between a macroscopic traffic capacity, the traffic density, and the vehicle speed in a traffic network. In building different simulated traffic environments, the user can select, as the target traffic flow macroscopic fundamental diagram according to actual simulation requirements, the traffic flow macroscopic fundamental diagram applicable to the current simulation from a number of traffic flow macroscopic fundamental diagrams provided in the simulation system, and then the parameters required for setting the background vehicle in the simulated traffic environment are determined accordingly according to the target traffic flow macroscopic fundamental diagram and the target traffic state indication parameter inputted by the user.

In order to facilitate the understanding of the above target traffic flow macroscopic fundamental diagram, an exemplary target traffic flow macroscopic fundamental diagram in this application is to be described below with reference to FIG. 3.

Figure 3:
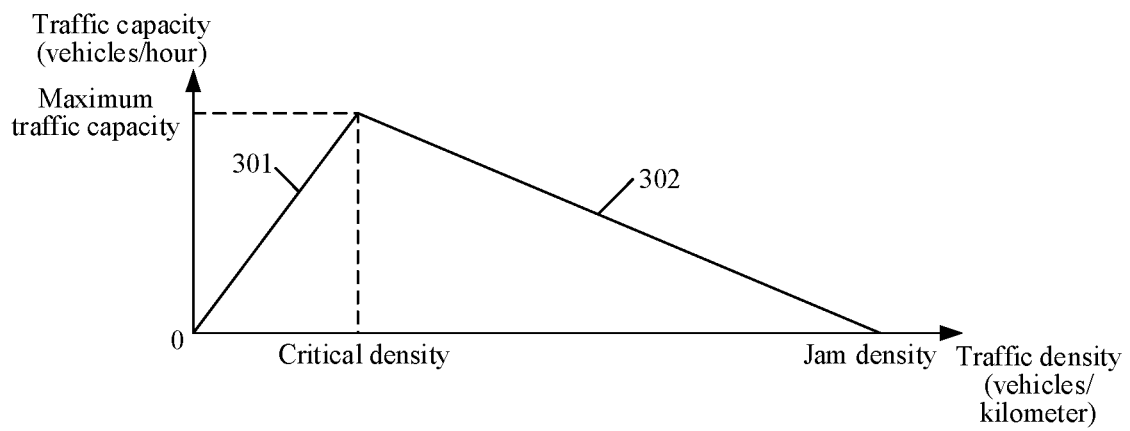
FIG. 3 shows a target traffic flow macroscopic fundamental diagram according to an embodiment of this application.

FIG. 3 shows an exemplary target traffic flow macroscopic fundamental diagram according to an embodiment of this application. As shown in FIG. 3, the target traffic flow macroscopic fundamental diagram is usually set in a coordinate system with a traffic density as a horizontal axis and traffic capacity as a vertical axis. The target traffic flow macroscopic fundamental diagram may include two linear segments: a linear segment 301 (a first linear segment) and a linear segment 302 (a second linear segment). The linear segment 301, the linear segment 302, and the horizontal axis of the coordinate axis form a triangle. Each point on the linear segment 301 and the linear segment 302 represents a traffic state, and the traffic state can indicate a relationship between the traffic capacity, the traffic density, and a vehicle speed. An ordinate of an intersection point of the linear segment 301 and the linear segment 302 is used as a maximum traffic capacity, an abscissa of the intersection point of the linear segment 301 and the linear segment 302 is used as a critical traffic density, and an abscissa of the intersection point of the linear segment 302 and the horizontal axis is used as a traffic jam density.

The linear segment 301 is configured for representing a free traveling state of the vehicle. A slope of the linear segment 301 is a free-flow vehicle speed. During an increase in the traffic density from 0 to the critical density, the vehicle in the simulated traffic environment can keep the free-flow vehicle speed unchanged. In this process, the traffic capacity of the simulated traffic environment gradually increases. When the traffic density reaches the critical density, the traffic capacity of the simulated traffic environment reaches the maximum traffic capacity.

The linear segment 302 is configured for representing a jammed traveling state of vehicles. As shown in the linear segment 302, after the traffic density of the simulated traffic environment reaches the critical density and the traffic capacity reaches the maximum traffic capacity, the continuous increase of vehicles in the simulated traffic environment will lead to a gradual increase in the traffic density and a gradual decrease in the vehicle speed, and vehicles are in the jammed traveling state. Correspondingly, the traffic capacity also decreases accordingly. When the traffic density reaches a jam density, the traffic flow enters a completely jammed stop state, and the vehicle speed and the traffic capacity are both reduced to 0.

The traffic flow macroscopic fundamental diagram shown in FIG. 3 is only an example. In practical application, when building a simulated traffic environment, the user may further select other shapes of traffic flow macroscopic fundamental diagrams as the target traffic flow macroscopic fundamental diagram. Alternatively, the user may select, as the target traffic flow macroscopic fundamental diagram, the traffic flow macroscopic fundamental diagram drawn according to other traffic flow parameters that can characterize the traffic state. No limitation is imposed on the target traffic flow macroscopic fundamental diagram for setting the background vehicle in the embodiments of this application.

In some cases, the traffic flow macroscopic fundamental diagram provided in the simulation system may not meet the simulation needs of users. In order to ensure that the users can build a simulated traffic environment that meets their simulation needs, the driving simulation method provided in the embodiments of this application can also support users in customizing the target traffic flow macroscopic fundamental diagram.

For example, the terminal device may display a second configuration interface to the user, and receive a traffic flow quantification parameters inputted by the user through the second configuration interface, the traffic flow quantification parameters including a free-flow vehicle speed, a jam density, a critical density, and a maximum traffic capacity. As a result, the terminal device generates the target traffic flow macroscopic fundamental diagram according to the traffic flow quantitative parameters inputted by the user.

Based on the above introduction to the traffic flow macroscopic fundamental diagram shown in FIG. 3, it can be seen that when the traffic flow macroscopic fundamental diagram is drawn, the terminal device usually needs to know the traffic flow quantification parameters such as the free-flow vehicle speed, the jam density, the critical density, and the maximum traffic capacity. Furthermore, the terminal device may determine, according to the free-flow vehicle speed, the critical density, and the maximum traffic capacity, the linear segment configured for representing the free traveling state of the vehicle, and determine, according to the critical density, the maximum traffic capacity, and the jam density, the linear segment configured for representing the jammed traveling state of the vehicle. In this way, the target traffic flow macroscopic fundamental diagram that meets the actual simulation needs of the user is determined.

It is to be understood that when the target traffic flow macroscopic fundamental diagram required by the user to build a simulated traffic environment is in other shapes, or the target traffic flow macroscopic fundamental diagram needs to be built based on other traffic flow quantification parameters, the terminal device may accordingly obtain, through the second configuration interface, other traffic flow quantification parameters required for drawing the traffic flow macroscopic fundamental diagram, and draw the target traffic flow macroscopic fundamental diagram according to the obtained traffic flow quantification parameters in a specific manner. Herein, no limitation is imposed on the traffic flow quantification parameters obtained in the second configuration interface and the manner in which the terminal device draws the target traffic flow macroscopic fundamental diagram.

For example, the reference vehicle-to-vehicle distance and the reference vehicle speed are determined according to the target traffic flow macroscopic fundamental diagram, and the terminal device may adopt a specific processing method according to the type of the target traffic state indication parameter received by the first configuration interface to determine the reference vehicle-to-vehicle distance and the reference vehicle speed.

In some implementations, if the target traffic state indication parameter received by the terminal device through the first configuration interface is the target traffic density, the terminal device may use an inverse of the target traffic density as the reference vehicle-to-vehicle distance, determine a target traffic state corresponding to the target traffic density from the target traffic flow macroscopic fundamental diagram, determine a target traffic capacity that the target traffic state has in the target traffic flow macroscopic fundamental diagram, and use a ratio of the target traffic capacity to the target traffic density as the reference vehicle speed.

Based on the traffic flow macroscopic fundamental diagram shown in FIG. 3, it can be seen that when a traffic density is given, the traffic state of the simulated traffic environment may be uniquely determined according to the traffic flow macroscopic fundamental diagram, that is, the traffic capacity corresponding to the traffic density and the vehicle speed are uniquely determined. In addition, since there is a reciprocal relationship between the vehicle distance and the traffic density, the vehicle distance may also be determined according to the traffic density when the traffic density is given. In the linear segment 301 and the linear segment 302, a point whose abscissa is the target traffic density is regarded as a target traffic state, and the ordinate of the target traffic state is used as the target traffic capacity that the target traffic state has in the target traffic flow macroscopic fundamental diagram.

Based on the above principle, when the terminal device receives, as a target traffic density K, the target traffic state indication parameter inputted by the user through the first configuration interface, the terminal device may calculate the reference vehicle-to-vehicle distance D by using the formula (1):

$$D = 1/K \tag{1}$$

The reference vehicle-to-vehicle distance D herein may characterize a distance between heads of two adjacent vehicles in the target lane, or a distance between rears of two adjacent vehicles. The reference vehicle-to-vehicle distance D is equal to a sum of a body length of a standard background vehicle and an actual separation distance between two adjacent background vehicles. The actual separation distance between two adjacent background vehicles refers to a distance between the rear of the background vehicle in the front and the head of the background vehicle in the rear. In calculation of the reference vehicle speed according to the above principle, the terminal device can calculate the reference vehicle speed V by using formula (2) and formula (3):

$$V = V_{max} (K \le K_{cr}) \tag{2}$$

$$V = (KQ_{max}/(K_{cr}-K_{jam}) + k_{jam}Q_{max}/(K_{jam}-K_{cr}))/K \quad (K > K_{cr}) \tag{3}$$

Figure 4A:
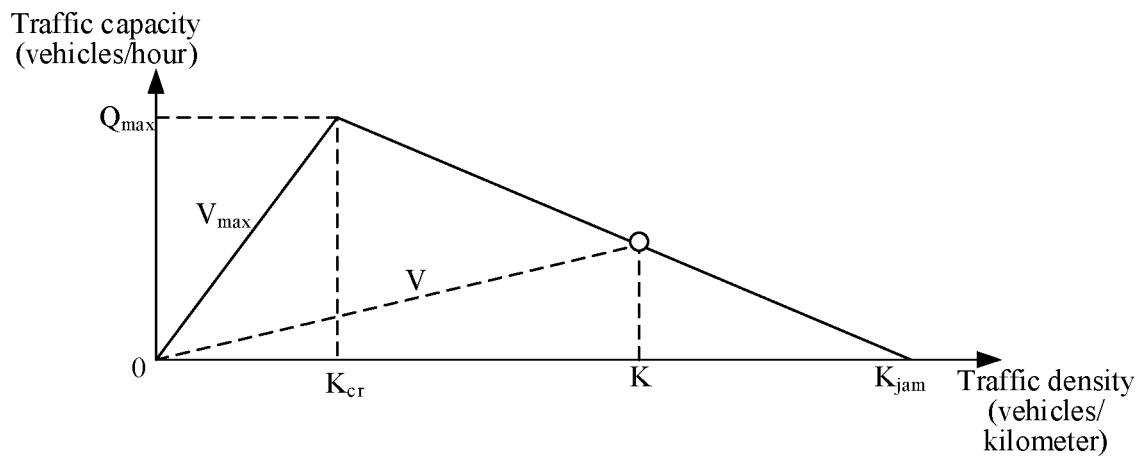
FIG. 4A is a schematic diagram of a principle of calculating a reference vehicle speed according to an embodiment of this application.

As shown in FIG. 4A, K is the target traffic density inputted by the user, $V_{max}$ is a free-flow speed in the target traffic flow macroscopic fundamental diagram, $Q_{max}$ is the maximum traffic capacity in the target traffic flow macroscopic fundamental diagram, and $K_{cr}$ is a critical density in the target traffic flow macroscopic fundamental diagram, $K_{jam}$ is the jam density in the target traffic flow macroscopic fundamental diagram.

In another implementation, if the target traffic state indication parameter received by the terminal device through the first configuration interface is the target traffic capacity and the target vehicle speed, the terminal device may directly use the received target vehicle speed as the reference vehicle speed, determine a target traffic state corresponding to the target traffic capacity and the target vehicle speed from the target traffic flow macroscopic fundamental diagram, determine the target traffic density that the target traffic state has in the target traffic flow macroscopic fundamental diagram, and use the inverse of the target traffic density as the reference vehicle-to-vehicle distance.

Based on the traffic flow macroscopic fundamental diagram shown in FIG. 3, it can be seen that when the traffic capacity and the target vehicle speed are given, the traffic density corresponding to a combination of the traffic capacity and the target vehicle speed may be uniquely determined according to the traffic flow macroscopic fundamental diagram. In addition, since there is a reciprocal relationship between the vehicle distance and the traffic density, the vehicle distance may be determined according to the traffic density when the traffic density is determined. In the linear segment 301 and the linear segment 302, the point whose ordinate is the target traffic capacity and which is connected to an origin of the coordinate system to form a line with a slope that is the target vehicle speed is determined as the target traffic state, and the abscissa of the target traffic state is used as the target traffic density that the target traffic state has in the target traffic flow macroscopic fundamental diagram.

Based on the above principle, when the terminal device receives the target traffic capacity Q and the target vehicle speed V inputted by the user through the first configuration interface, the terminal device may calculate the target traffic density K by using the formula (4) and formula (5):

$$K = Q/V_{max} (V = V_{max}) \tag{4}$$

$$K = K_{jam}Q_{max}/(Q_{max}-V(K_{cr}-K_{jam}))(V<V_{max}) \tag{5}$$

As shown in FIG. 4A, $V_{max}$ is a free-flow speed in the target traffic flow macroscopic fundamental diagram, $Q_{max}$ is the maximum traffic capacity in the target traffic flow macroscopic fundamental diagram, and $K_{cr}$ is a critical density in the target traffic flow macroscopic fundamental diagram, $K_{jam}$ is the jam density in the target traffic flow macroscopic fundamental diagram.

After the target traffic density K is calculated, the terminal device may calculate the reference vehicle-to-vehicle distance D by using the above formula (1) according to the target traffic density K.

It is to be understood that if the target traffic flow macroscopic fundamental diagram is in other shapes or is drawn according to other traffic flow parameters that can characterize the traffic state, the terminal device may accordingly obtain other basic parameters through the first configuration interface, and determine the reference vehicle speed and the reference vehicle-to-vehicle distance according to the obtained basic parameters by adopting other specific calculation methods.

For example, when determining the target background vehicle quantity of the target lane according to the target background vehicle quantity indication parameter of the target lane, the terminal device may accordingly adopt specific determining methods according to the type of the target background vehicle quantity indication parameter received by itself through the first configuration interface to determine the target background vehicle quantity in the target lane.

In some implementations, when the target background vehicle quantity indication parameter received by the terminal device through the first configuration interface is the target background vehicle quantity parameter, and the target background vehicle quantity parameter is used for indicating the target vehicle quantity of the target lane, then the terminal device may directly use the target vehicle quantity indicated by the target background vehicle quantity parameter as the quantity of target background vehicles in the target lane in the simulated traffic environment.

In another implementation, when the target background vehicle quantity indication parameter received by the terminal device through the first configuration interface is the location range indication parameter, the terminal device may determine the target background vehicle quantity of the target lane according to the location range indication parameter of the target background vehicle and the reference vehicle-to-vehicle distance. The location range indication parameter is used for indicating a location range of the generated background vehicle. The location range is usually a range that can verify the decision algorithm of the test vehicle. During setting, the location range parameter can be set according to a parking sight distance of the test vehicle. For example, the location of the test vehicle may be used as the center, and twice the parking sight distance of the test vehicle may be used as the length of the above location range, that is, the parking sight distance of the test vehicle is used as the radius, so that the location range for generating the background vehicle is determined in the target lane.

Under the condition that the reference vehicle-to-vehicle distance is determined, the terminal device may determine the target background vehicle quantity of the target lane according to the location range indicated by the location range indication parameter and the reference vehicle-to-vehicle distance.

For example, the location range indication parameter of the target background vehicle inputted by the user through the first configuration interface may include a first distance parameter R1 and a second distance parameter R2. R1 is configured to indicate the maximum distance between the test vehicle and a background vehicle of the test vehicle in a forward direction, and R2 is configured to indicate the maximum distance between the test vehicle and a background vehicle of the test vehicle in a reverse direction. Correspondingly, when determining the target background vehicle quantity of the target lane according to the location range parameter, a ratio of R1 to the reference vehicle-to-vehicle distance may be determined, and the ratio of R1 to the reference vehicle-to-vehicle distance may be used as a quantity M1 of background vehicles in the target lane in front of the test vehicle. A ratio of R2 to the reference vehicle-to-vehicle distance is determined, and the ratio of R2 to the reference vehicle-to-vehicle distance is used as a quantity M2 of target vehicles in the target lane in rear of the test vehicle.

The determination of the above location range is usually implemented according to the Frenet coordinate system, that is, a center line of the target lane is used as an ordinate axis of the coordinate system, and a line perpendicular to the center line is used as an abscissa axis of the coordinate system.

The first distance parameter R1 and the second distance parameter R2 may be equal or different. In practical application, both the first distance parameter R1 and the second distance parameter R2 may be both set as the parking sight distance of the test vehicle. The user may also set any value as the first distance parameter R1 and/or the second distance parameter R2 according to actual simulation requirements, and no limitation is imposed on the first distance parameter R1 and the second distance parameter R2 herein.

The terminal device may further obtain a target background vehicle quantity indication parameter in other forms through the first configuration interface. Accordingly, the terminal device may adopt a corresponding method to determine the target background vehicle quantity of the target lane according to the target background vehicle quantity indication parameter in this form. No limitation is imposed on the form of the target background vehicle quantity indication parameter and the target background vehicle quantity of the target lane determined by the terminal device.

When the basic parameters received by the terminal device through the first configuration interface include the reference vehicle-to-vehicle distance, the reference vehicle speed, and the target background vehicle quantity of the target lane, the terminal device uses the reference vehicle-to-vehicle distance, the reference vehicle speed, and the target background vehicle quantity of the target lane as relevant parameters for setting the background vehicle in the simulated traffic environment without additional calculation processing.

Step 203: Determine an initial location of each of background vehicles in the target lane based on a location of the test vehicle, the reference vehicle-to-vehicle distance, and a random distance deviation, and determine an initial speed of each of the background vehicles in the target lane based on the reference vehicle speed and a random speed deviation.

After determining the reference vehicle-to-vehicle distance, the reference vehicle speed, and the target background vehicle quantity of the target lane, the terminal device may determine an initial location of an $i^{th}$ background vehicle in the target lane one by one according to a location of the test vehicle, the reference vehicle-to-vehicle distance, and the random distance deviation, and determine an initial speed of the $i^{th}$ background vehicle in the target lane one by one according to the reference vehicle speed and the random speed deviation.

It is to be understood that in practical application, the terminal device may determine the location of the test vehicle in the simulated traffic environment according to the parameters inputted by the user on the relevant configuration interface. For example, the user may set a second lane of the test vehicle in the simulated traffic environment through the relevant configuration interface. Correspondingly, during building of the simulated traffic environment, the terminal device sets the test vehicle in the second lane. Certainly, the terminal device may also automatically set the location of the test vehicle in the simulated traffic environment according to the actual simulation requirements of the user, and no limitation is imposed on the method for setting the location of the test vehicle herein.

It is to be understood that both the random distance deviation and the random speed deviation are randomly determined for each background vehicle, so as to ensure that the random distance deviation and the random speed deviation corresponding to different background vehicles are different as much as possible, thereby ensuring the diversity of the background vehicles in the simulation process. Specifically, the random distance deviation and the random speed deviation for the background vehicle may be determined according to a normal distribution or a chi-square distribution. The method for determining the random distance deviation and the random speed deviation is not limited herein. The following first introduces the method for determining the initial location of each of the background vehicles in the target lane. When the terminal device determines the initial location of the background vehicle in the target lane in front of the test vehicle, the random distance deviation may be first added to the reference vehicle-to-vehicle distance to obtain a first front distance, and a location at the first front distance from the head of the test vehicle may be used as the initial location of the first background vehicle in front of the test vehicle, that is, the terminal device may set the first background vehicle in front of the test vehicle at the location at the first front distance from the head of the test vehicle. Then, the random distance deviation is added to the reference vehicle-to-vehicle distance to obtain a second front distance. A location at the second front distance from the initial location of the first background vehicle in front of the test vehicle may be used as an initial location of the second background vehicle in front of the test vehicle; and so on. The initial locations of the background vehicles in front of the test vehicle are set one by one until the quantity of background vehicles in front of the test vehicle reaches a preset quantity of background vehicles in front of the test vehicle.

Similarly, when the terminal device determines the initial location of the background vehicle in the target lane in rear of the test vehicle, the random distance deviation may be first added to the reference vehicle-to-vehicle distance to obtain a first rear distance, and a location at the first rear distance from the rear of the test vehicle may be used as the initial location of the first background vehicle in rear of the test vehicle, that is, the terminal device may set the first background vehicle in rear of the test vehicle at the location at the first rear distance from the head of the test vehicle. Then, the random distance deviation is added to the reference vehicle-to-vehicle distance to obtain a second rear distance. A location at the second front distance from the initial location of the first background vehicle in rear of the test vehicle may be used as an initial location of the second background vehicle in rear of the test vehicle; and so on. The initial locations of the background vehicles in rear of the test vehicle are set one by one until the quantity of background vehicles in rear of the test vehicle reaches a preset quantity of background vehicles in rear of the test vehicle.

It is to be understood that the above random distance deviation may be a positive value or a negative value. Since when determining of the initial location of each of the background vehicles, different random distance deviations are added to the reference vehicle-to-vehicle distance, and the initial location of each of the background vehicles is determined according to the vehicle-to-vehicle distance plus the deviation. Therefore, it can be ensured that the initial locations of the background vehicles are random and diverse, so as to build a more real traffic scene.

The following introduces the method for determining the initial speed of each of the background vehicles in the target lane. Specifically, when the initial speed is set for a background vehicle, a random speed deviation may be added to the reference vehicle speed, and the vehicle speed plus the random speed deviation is set as the initial speed of the background vehicle. In this way, the initial speeds of the background vehicles are determined in the simulated traffic environment.

Since when determining of the initial speed of each of the background vehicles, the reference vehicle speed is increased by different random speed deviations, so that it can be ensured that the initial speeds of the background vehicles are random and diverse, so as to be more consistent with the traveling state of the vehicle in a real traffic scene.

For example, when determining the initial location of an $i^{th}$ background vehicle in the target lane, the adopted random distance deviation may be a normal random variable conforming to a first normal distribution, and when the initial speed of the $i^{th}$ background vehicle in the target lane is determined, the adopted random speed deviation may be a normal random variable conforming to a second normal distribution. That is, the initial locations of the background vehicles may be determined according to the random distance deviation conforming to the normal distribution, and the initial speeds of the background vehicles may be determined according to the random speed deviation conforming to the normal distribution.

It is to be understood that in actual application, the random distance deviation and the random speed deviation may also be determined in other manners. no limitation is imposed on the method for determining the random distance deviation and the random speed deviation herein.

When the simulated traffic environment includes S target lanes (a value for S is a positive integer greater than 1), the terminal device needs to determine a quantity of target background vehicles in the S target lanes. For a $j^{th}$ (a value for j is a positive integer not exceeding S) target lane, the terminal device may sequentially determine an initial location of an $i^{th}$ background vehicle in the $j^{th}$ target lane according to a location of the test vehicle, the reference vehicle-to-vehicle distance, and a random distance deviation, and sequentially determine an initial speed of the $i^{th}$ background vehicle in the $j^{th}$ target lane according to the reference vehicle speed and a random speed deviation. For example, during setting of the initial locations and the initial speeds for the background vehicles in the target lane in which the test vehicle is located, the terminal device may directly determine the corresponding initial location and initial speed of each of the background vehicles according to the above method. During setting of the initial location and the initial speed for the background vehicles in other target lanes, the terminal device may first translate the location of the test vehicle to the target lane in a direction perpendicular to the target lane, and the translated location is used as the reference position. Furthermore, the corresponding initial locations and initial speeds of the background vehicles in the target lane are determined in the above manner according to the reference location.

Step 204: Simulate traveling of each of the background vehicles in a simulated traffic environment based on the initial location and the initial speed of each of the background vehicles and the background vehicle quantity.

After the terminal device determines the respective initial locations and initial speeds of the N background vehicles, autonomous driving simulation may be started in the simulated traffic environment. During the simulation, a vehicle fleet composed of the test vehicle and the background vehicles moves along the target road together. The traveling law may usually follow the following model.

During the simulation, the terminal device needs to fix the speed of the headmost background vehicle of all background vehicles, and update speeds of other background vehicles according to the following model. The following model is constructed based on the microscopic driving behavior of the car following (CF), which is used for describing interaction between two adjacent cars in the vehicle fleet on a one-way road that restricts overtaking. The following model uses a dynamic method to study the corresponding behavior of the following car caused by changes in motion states of the leading vehicle (LV), and to understand traffic flow characteristics of a single lane by analyzing the way of the vehicles following each other one by one. The background vehicles are classified into a leading background vehicle (the headmost vehicle of all background vehicles) and following background vehicles (background vehicles other than the leading background vehicle). The speed of the leading background vehicle is fixed, and speeds of the following background vehicles are updated, so that the following background vehicle follows the leading vehicle.

During initial setting of the simulation scene, when the requirement for the surrounding traffic state by a to-be-tested scene is a non-free driving state, the initial speed of the background vehicle needs to be set to be less than the free-flow vehicle speed. In the following model, since the background vehicle traveling in the headmost does not need to be followed by the preceding vehicle, the background vehicle at the headmost will gradually accelerate to the free-flow speed and pull out of the preset location range (that is, a valid test range for the test vehicle) without other speed constraints. Correspondingly, with the extension of the simulation time, other background vehicles following the background vehicle will gradually enter the free traveling state and pull out of the preset location range. The background vehicles around the test vehicle gradually decrease, and the decision algorithm of the test vehicle cannot be effectively verified. In addition, when the simulation time is long enough, as the background vehicle in front of the test vehicle gradually accelerates to the free-flow speed and pulls out of the preset position range, the traffic state of the test vehicle will passively change to a free traveling state, and the surrounding traffic state is deviated to the initial setting of the non-free driving state.

In order to prevent the occurrence of the above situation, when the terminal device updates the speed and location of the background vehicle according to the following model during the simulation, the speed of the background vehicle at the front is fixed, and the background vehicle is controlled not to accelerate to the free-flow vehicle speed according to the following model, so that the background vehicle is always within the preset location range.

The foregoing driving simulation method only requires a tester to input a small number of basic parameters through the first configuration interface to complete the setting of the background vehicles in the simulated traffic environment, which greatly simplifies the operations that the tester needs to perform, and improves the efficiency of building a simulated traffic environment. In addition, the method further considers the random speed deviation and the random location deviations in the process of setting the background vehicles, thereby ensuring the diversity and randomness of traveling states of the set background vehicles, so that the simulated traffic environment is more realistic. In addition, during the simulation, the speed of the background vehicle at the front is fixed, and on this basis, the speed constraints on other background vehicles in the following model are implemented, thereby preventing the background vehicles from gradually pulling out of the effective test range for the test vehicle due to lack of speed constraints on the background vehicles in the simulation traffic environment. A quantity of vehicles around the test vehicle gradually decreases, which makes it impossible to effectively test the decision algorithm of the test vehicle.

In order to facilitate the understanding of the driving simulation method shown in FIG. 2, the foregoing driving simulation method is exemplified below in combination with specific examples.

When a user needs to build a simulated traffic environment, the user may first configure the free-flow vehicle speed, a jam density, a critical density, and the maximum traffic capacity through the second configuration interface displayed by the terminal device. For example, it is assumed that the user sets the free-flow vehicle speed to 80 kilometers/hour, the jam density to 140 vehicles/kilometer, the critical density to 25 vehicles/kilometer, and the maximum traffic capacity to 2000 vehicles/hour. After the terminal device receives the parameters inputted by the user through the second configuration interface, a target traffic flow macroscopic fundamental diagram applicable to the current simulation is to be built according to the parameters, as shown in FIG. 4B.

Furthermore, the terminal device will display, to the user, the first configuration interface configured to configure basic parameters. The user may input the target traffic density and the location range indication parameter through the first configuration interface. The location range indication parameter may include a first distance parameter and a second distance parameter. For example, it is assumed that the target traffic density inputted by the user is 48 vehicles/kilometer, and the first distance parameter and the second distance parameter are both 100 meters. The terminal device calculates an inverse of the target traffic density of 48 vehicles/kilometer as the reference vehicle-to-vehicle distance, that is, the reference vehicle-to-vehicle distance is determined to be 20.83 meters by dividing 1000 (converting kilometers to meters) by 48, that is, a distance between two adjacent background vehicles is 20.83 meters. Furthermore, a quantity of background vehicles that need to be set before the test vehicle may be determined according to the first distance parameter and the reference vehicle-to-vehicle distance. For example, the terminal device determines, by dividing 100 by 20.83, that 5 background vehicles need to be set before the test vehicle. Similarly, the terminal device determines that 5 background vehicles also need to be set in rear of the test vehicle.

Figure 4B:
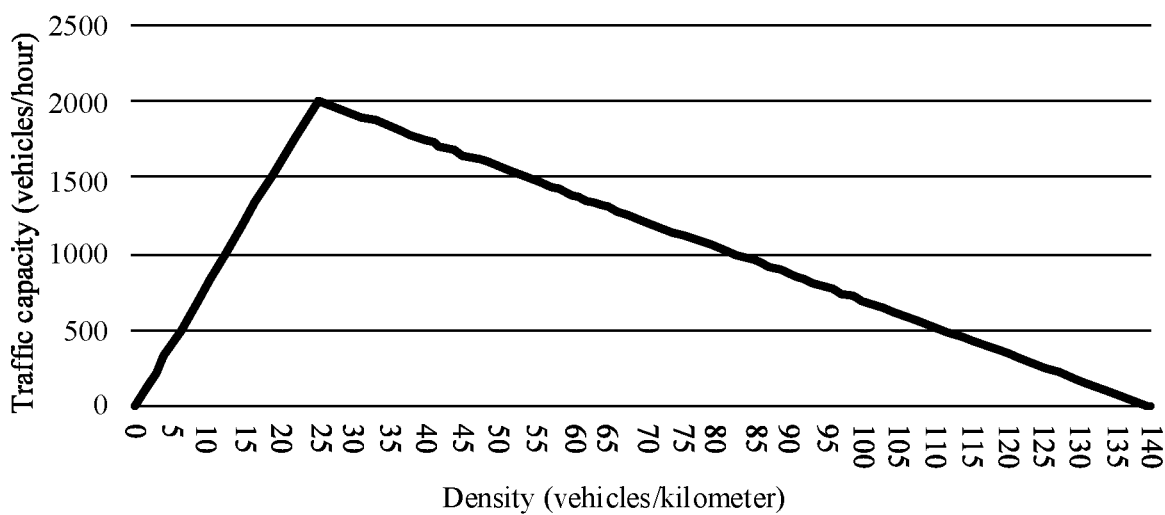
FIG. 4B shows the target traffic flow macroscopic fundamental diagram according to an embodiment of this application.
Figure 4C:
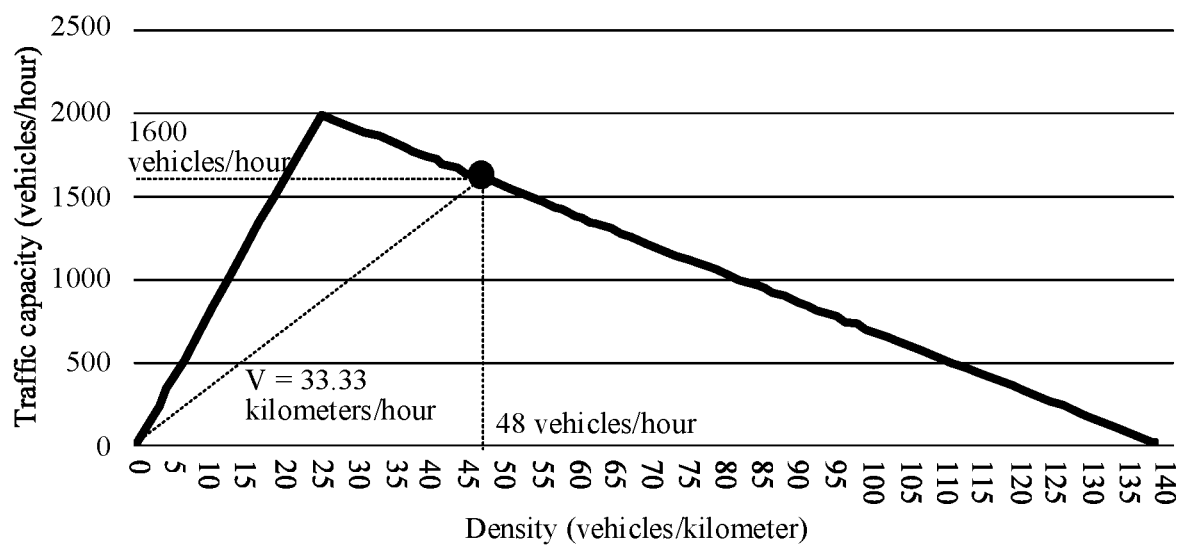
FIG. 4C is a schematic diagram of a principle of calculating a reference vehicle speed according to an embodiment of this application.

In addition, the terminal device further needs to determine the target traffic capacity of the current simulation according to the target traffic flow macroscopic fundamental diagram shown in FIG. 4B and the target traffic density inputted by the user. As shown in FIG. 4C, in the target traffic flow macroscopic fundamental diagram, a target traffic capacity corresponding to a target traffic density of 48 vehicles/kilometer is 1600 vehicles/hour. Furthermore, a ratio of the target traffic capacity of 1600 vehicles/hour to the target traffic density of 48 vehicles/kilometer is calculated as the reference vehicle speed for the current simulation, that is, the reference vehicle speed of 33.33 kilometers/hour is obtained by dividing 1600 by 48.

Figure 4D:
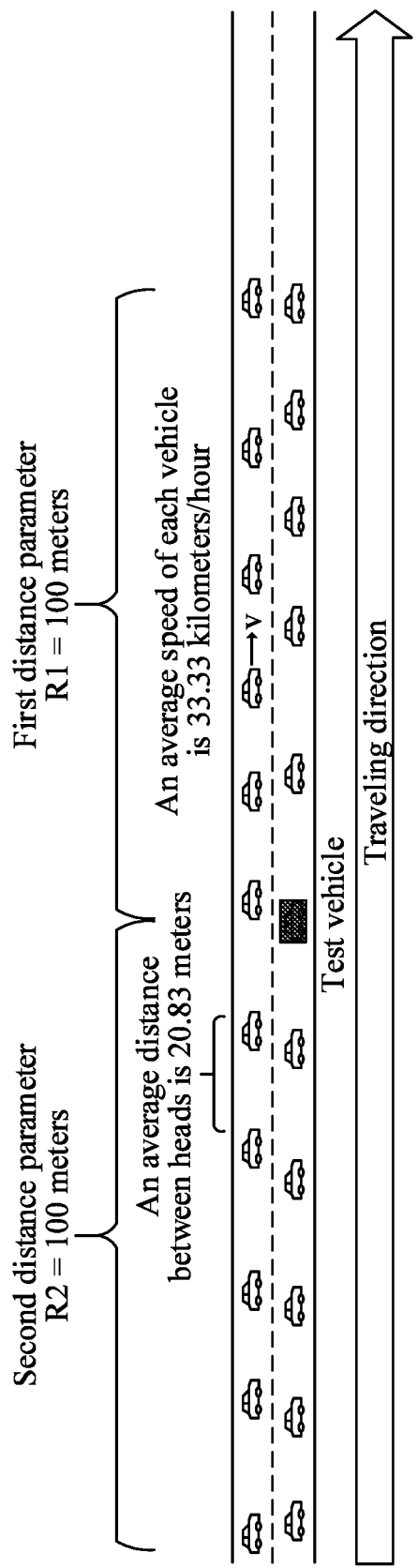
FIG. 4D is a schematic diagram of a driving simulation interface according to an embodiment of this application.

In this way, it is determined that 5 background vehicles need to be set respectively before and after the test vehicle in the current simulation, the reference vehicle-to-vehicle distance is 20.83 meters, and the reference vehicle speed is 33.33 kilometers/hour. Correspondingly, in setting the background vehicles in a simulated traffic environment, the terminal device may determine the initial location of each background vehicle by adding a random distance deviation to the reference vehicle-to-vehicle distance, and determine the initial speed of each background vehicle by adding a random speed deviation to the reference vehicle speed, thus implementing autonomous driving simulation. The built simulation traffic environment is shown in FIG. 4D.

In order to facilitate the understanding of the driving simulation method provided in the embodiments of this application, the method for setting a background vehicle by the terminal device in a simulated traffic environment and the method for driving simulation by the terminal device are separately introduced as a whole with reference to FIG. 5 and FIG. 6A to FIG. 6B below.

Figure 5:
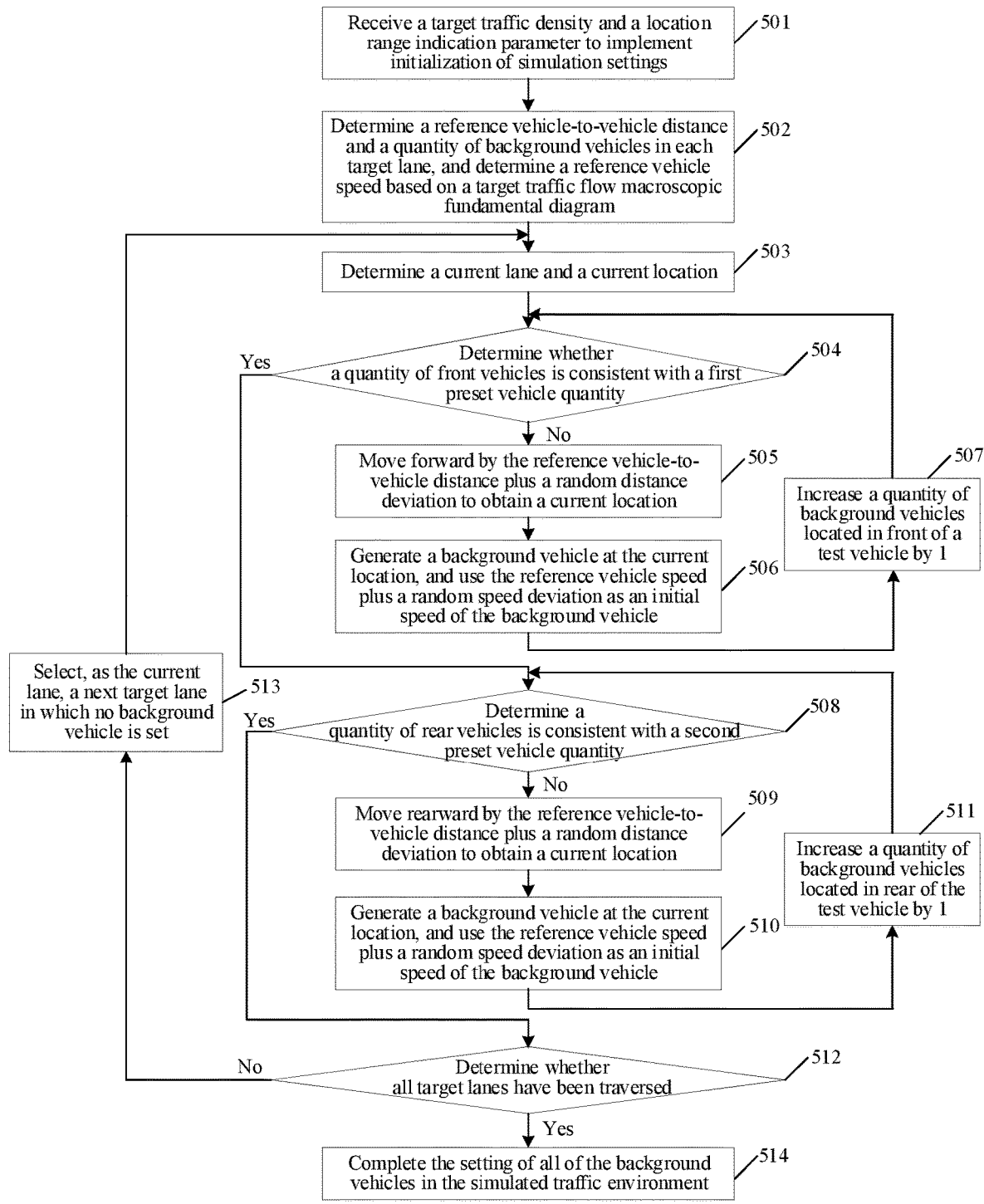
FIG. 5 is a schematic flowchart of a method for setting background vehicles according to an embodiment of this application.

FIG. 5 is a schematic flowchart of a method for setting background vehicles in a simulated traffic environment according to an embodiment of this application. As shown in FIG. 5, the method includes the following steps.

Step 501: A terminal device receives a target traffic density and a location range indication parameter inputted by a user through a first configuration interface, so as to implement initialization of simulation settings.

Step 502: The terminal device determines an inverse of the target traffic density as a reference vehicle-to-vehicle distance, and determines, according to the reference vehicle-to-vehicle distance and the location range indication parameter inputted by the user, a quantity of background vehicles that need to be generated in each target lane. For example, a quantity of vehicles located in front of a test vehicle and a quantity of vehicles located in each target lane in rear of the test vehicle need to be determined.

The terminal device determines, according to the target traffic flow macroscopic fundamental diagram selected or customized by the user, the target traffic capacity corresponding to the target traffic density inputted by the user, and then calculates a ratio of the target traffic capacity to the target traffic density as the reference vehicle speed of the background vehicle.

Step 503: Use, as a current lane, the current target lane in which background vehicles need to be set, and use a location of the test vehicle as a current location. It is to be understood that if there is no test vehicle in the current lane, the test vehicle is translated to the current lane in a direction perpendicular to the lane, and further, the location of the translated test vehicle in the current lane is used as the current location.

Step 504: Determine whether a quantity of vehicles in front of the test vehicle is consistent with a first preset vehicle quantity, the first preset vehicle quantity being the quantity of vehicles located in the target lane in front of the test vehicle determined in step 502. If so, step 508 is performed, and if not, step 505 is performed.

Step 505: Use the current location as a reference to move forward by a distance corresponding to the reference vehicle-to-vehicle distance plus a random distance deviation, and use the determined location in such a way as a new current location.

Step 506: Set a background vehicle at the current location determined in step 505, add a random speed deviation to the reference vehicle speed determined in step 502, and use the determined speed in such a way as an initial speed of the set background vehicle.

Step 507: Increase the quantity of background vehicles in front of the test vehicle by 1 to obtain the updated quantity of vehicles in front of the test vehicle, and perform step 504.

Step 508: Determine whether a quantity of vehicles in rear of the test vehicle is consistent with a second preset vehicle quantity, the second preset vehicle quantity being the quantity of vehicles located in the target lane in rear of the test vehicle determined in step 502. If so, step 512 is performed, and if not, step 509 is performed.

Step 509: Use, as a reference, the current location determined in step 503 to move rearward by a distance corresponding to the reference vehicle-to-vehicle distance plus a random distance deviation, and use the determined location in such a way as a new current location.

Step 510: Set a background vehicle at the current location determined in step 509, add a random speed deviation to the reference vehicle speed determined in step 502, and use the determined speed in such a way as an initial speed of the set background vehicle.

Step 511: Increase the quantity of background vehicles in rear of the test vehicle by 1 to obtain the updated quantity of vehicles in rear of the test vehicle, and perform step 508.

Step 512: Determine whether all target lanes have been traversed, that is, determine whether the setting of the background vehicles in all of the target lanes has been completed; if so, perform step 514, and if not, perform step 513.

Step 513: Select, as the current lane, a next target lane in which no background vehicle is set, and perform step 503.

Step 514: Confirm that the setting of all of the background vehicles in the simulated traffic environment is completed.

Figure 6A:
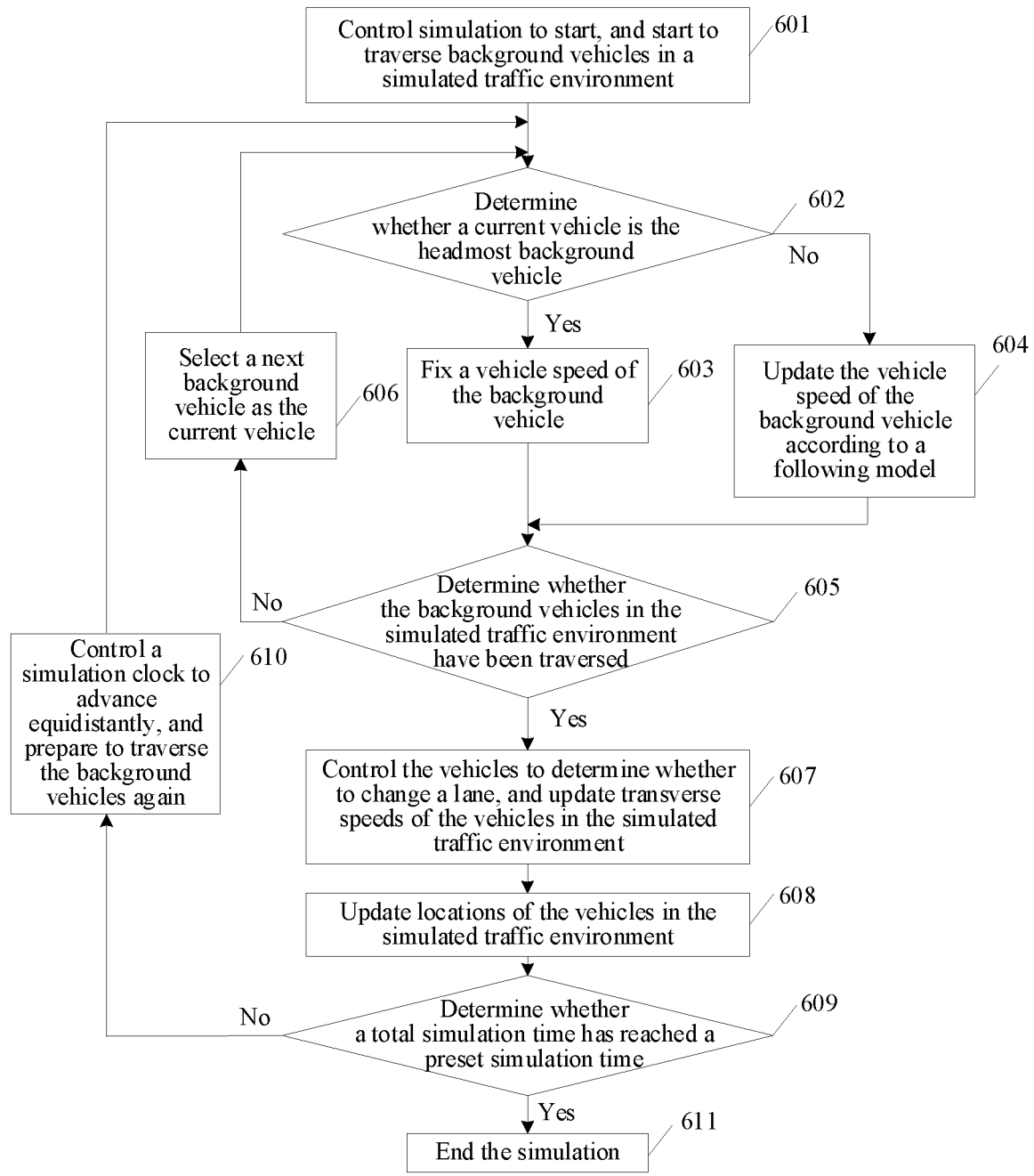
FIG. 6A to FIG. 6B are schematic flowcharts of a driving simulation process according to an embodiment of this application.

FIG. 6A is a schematic flowchart of a driving simulation process according to an embodiment of this application. As shown in FIG. 6A, the driving simulation process includes the following steps.

Step 601: Upon completion of setting of the background vehicles in the simulated traffic environment, the terminal device may control simulation to start and start to traverse the background vehicles in the simulated traffic environment.

Step 602: Determine whether the current vehicle is the headmost background vehicle; if so, perform step 603, and if not, perform step 604.

Step 603: Fix a vehicle speed of the background vehicle.

Step 604: Update the vehicle speed of the background vehicle according to a following model.

Step 605: Determine whether the background vehicles in the simulated traffic environment have been traversed; if so, perform step 607, and if not, perform step 606.

Step 606: Select a next background vehicle in the simulated traffic environment as the current vehicle, and perform step 602.

Step 607: Control the vehicles in the simulated traffic environment to determine whether to change a lane, and update transverse speeds of the vehicles in the simulated traffic environment.

Step 608: Update locations of the vehicles in the simulated traffic environment.

Step 609: Determine whether a total simulation time of the current simulation has reached a preset simulation time; if so, perform step 611, and if not, perform step 610.

Step 610: Control a simulation clock to advance equidistantly, and prepare to traverse the background vehicles in the simulated traffic environment again.

Step 611: Determine that the current simulation ends.

Figure 6B:
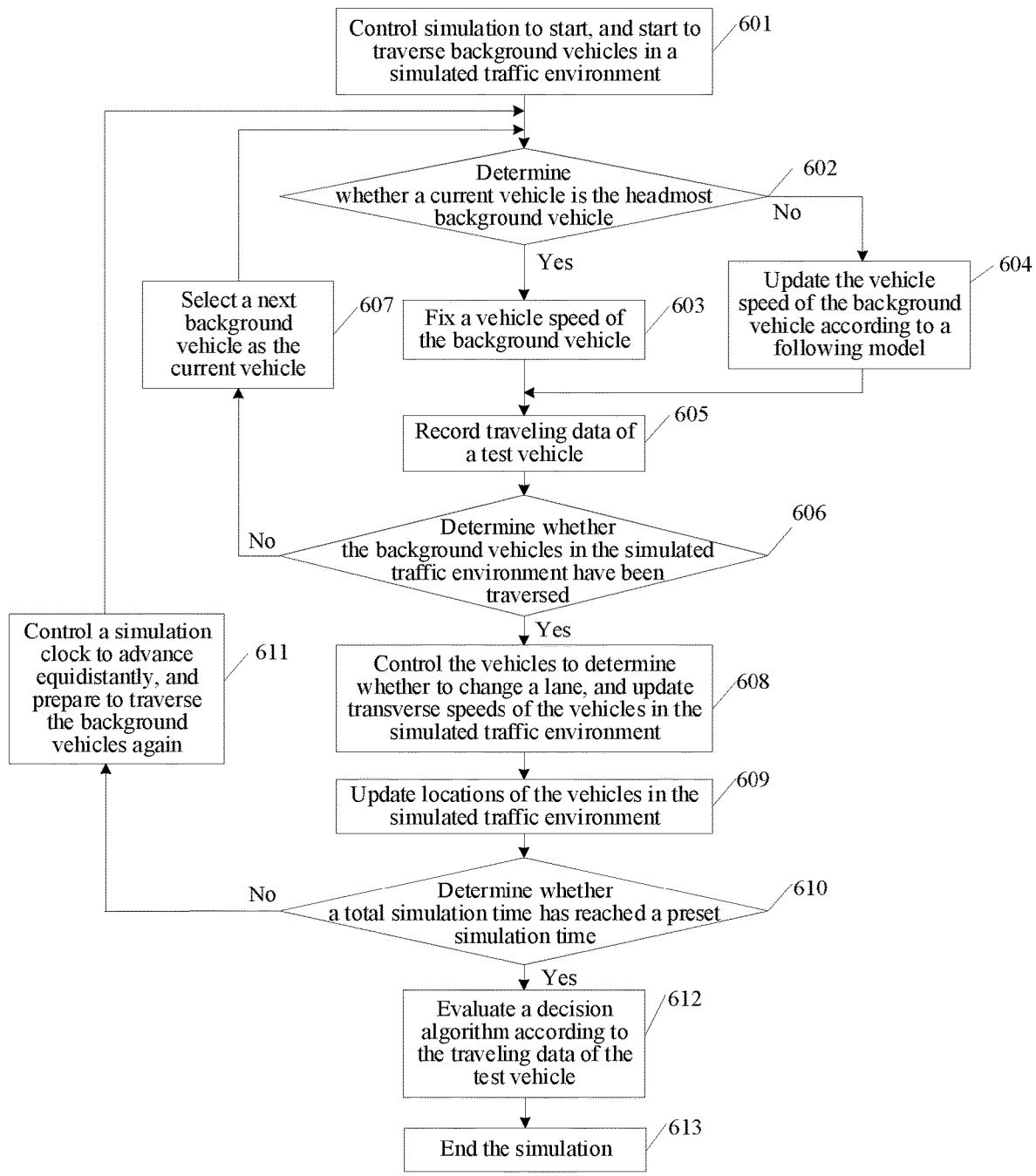

FIG. 6B is a schematic flowchart of a driving simulation process according to an embodiment of this application. As shown in FIG. 6B, the driving simulation process includes the following steps.

Step 601: Upon completion of setting of the background vehicles in the simulated traffic environment, the terminal device may control the simulation to start running and start to traverse the background vehicles in the simulated traffic environment.

Step 602: Determine whether the current vehicle is the headmost background vehicle; if so, perform step 603, and if not, perform step 604.

Step 603: Fix a vehicle speed of the background vehicle.

Step 604: Update the vehicle speed of the background vehicle according to a following model.

Step 605: Record traveling data of the test vehicle.

Step 606: Determine whether the background vehicles in the simulated traffic environment have been traversed; if so, perform step 608, and if not, perform step 607.

Step 607: Select a next background vehicle in the simulated traffic environment as the current vehicle, and perform step 602.

Step 608: Control the vehicles in the simulated traffic environment for lane-changing determination, and update transverse speeds of the vehicles in the simulated traffic environment.

Step 609: Update locations of the vehicles in the simulated traffic environment.

Step 610: Determine whether a total simulation time of the current simulation has reached a preset simulation time; if so, perform step 612, and if not, perform step 611.

Step 611: Control a simulation clock to advance equidistantly, and prepare to traverse the background vehicles in the simulated traffic environment again.

Step 612: Evaluate a decision algorithm according to the traveling data of the test vehicle.

Step 613: Determine that the current simulation ends.

For the driving simulation method described above, this application further provides a corresponding driving simulation apparatus, so that the driving simulation method can be applied and implemented in practice.

Figure 7:
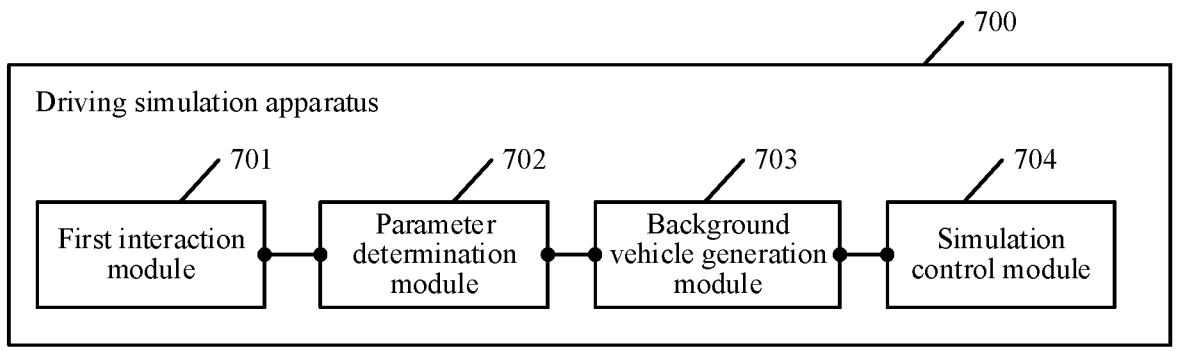
FIG. 7 is a schematic structural diagram of a driving simulation apparatus according to an embodiment of this application.

FIG. 7 is a schematic structural diagram of a driving simulation apparatus 700 corresponding to the driving simulation method shown in FIG. 2 above. The driving simulation apparatus 700 includes:

a first interaction module 701, configured to display a first configuration interface, and receive parameters inputted through the first configuration interface;

a parameter determination module 702, configured to determine, based on the parameters, a reference vehicle-to-vehicle distance, a reference vehicle speed, and a background vehicle quantity of a target lane, the target lane including a lane in which a test vehicle and background vehicles are located;

a background vehicle generation module 703, configured to determine an initial location of each of background vehicles in the target lane based on a location of the test vehicle, the reference vehicle-to-vehicle distance, and a random distance deviation, and determine an initial speed of each of the background vehicles in the target lane based on the reference vehicle speed and a random speed deviation; and a simulation control module 704, configured to simulate traveling of each of the background vehicles in a simulated traffic environment based on the initial location and the initial speed of each of the background vehicles and the background vehicle quantity.

Figure 8:
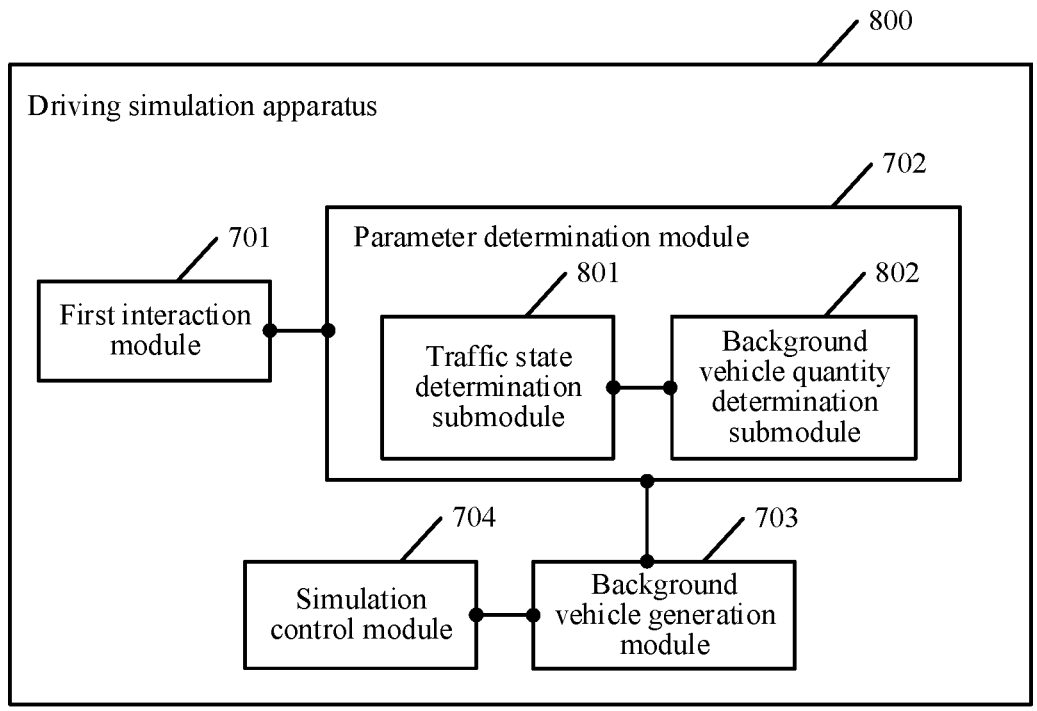
FIG. 8 is a schematic structural diagram of a driving simulation apparatus according to an embodiment of this application.

In some embodiments, on the basis of the driving simulation apparatus shown in FIG. 7, FIG. 8 is a schematic structural diagram of another driving simulation apparatus 800 according to an embodiment of this application.

When the first configuration interface includes a configuration control configured to configure a traffic state indication parameter and a configuration control configured to configure a background vehicle quantity indication parameter, the first interaction module 701 is configured to receive a target traffic state indication parameter and a target background vehicle quantity indication parameter inputted through the configuration controls on the first configuration interface.

The parameter determination module 702 includes a traffic state determination submodule 801 configured to determine the reference vehicle-to-vehicle distance and the reference vehicle speed according to the target traffic flow macroscopic fundamental diagram and the target traffic state indication parameter, and a background vehicle quantity determination submodule 802 configured to determine the background vehicle quantity in the target lane based on the target background vehicle quantity indication parameter of the target lane.

In some embodiments, on the basis of the driving simulation apparatus shown in FIG. 8, the target traffic state indication parameter includes a target traffic density, and the traffic state determination submodule 801 is configured to: use the inverse of the target traffic density as the reference vehicle-to-vehicle distance; and determine a target traffic state corresponding to the target traffic density from the target traffic flow macroscopic fundamental diagram, determine a target traffic capacity that the target traffic state has in the target traffic flow macroscopic fundamental diagram, and use a ratio of the target traffic capacity to the target traffic density as the reference vehicle speed.

In some embodiments, on the basis of the driving simulation apparatus shown in FIG. 8, the target traffic flow macroscopic fundamental diagram includes a first linear segment and a second linear segment located in a coordinate system, a horizontal axis of the coordinate system representing a traffic density, a vertical axis of the coordinate system representing the traffic capacity, and each point in the first linear segment and the second linear segment representing a traffic state. The traffic state determination submodule 801 is specifically configured to:

establish the following constraint relationships between the first linear segment and the second linear segment in the target traffic flow macroscopic fundamental diagram:

an ordinate of an intersection point of the first linear segment and the second linear segment is used as a maximum traffic capacity, an abscissa of the intersection point of the first linear segment and the second linear segment is used as a critical traffic density, and an abscissa of an intersection point of the second linear segment and the horizontal axis is used as a traffic jam density;

use, as the target traffic state, a point, in the first linear segment and the second linear segment that conform to the constraint relationships, whose abscissa is the target traffic density; and use an ordinate of the target traffic state as the target traffic capacity that the target traffic state has in the target traffic flow macroscopic fundamental diagram.

In some embodiments, on the basis of the driving simulation apparatus shown in FIG. 8, the target traffic state indication parameter includes a target traffic capacity and a target vehicle speed. The traffic state determination submodule 801 is configured to: determine a target traffic state corresponding to the target traffic capacity and the target vehicle speed from the target traffic flow macroscopic fundamental diagram, determine a target traffic density that the target traffic state has in the target traffic flow macroscopic fundamental diagram, and use an inverse of the target traffic density as the reference vehicle-to-vehicle distance; and determine the target vehicle speed as the reference vehicle speed.

In some embodiments, on the basis of the driving simulation apparatus shown in FIG. 8, the target traffic flow macroscopic fundamental diagram includes a coordinate system and the first linear segment and the second linear segment located in the coordinate system, a horizontal axis of the coordinate system representing a traffic density, a vertical axis of the coordinate system representing the traffic capacity, and each point in the first linear segment and the second linear segment representing a traffic state. The traffic state determination sub-module 801 is configured to:

establish the following constraint relationships between the first linear segment and the second linear segment in the target traffic flow macroscopic fundamental diagram:

an ordinate of an intersection point of the first linear segment and the second linear segment is used as a maximum traffic capacity, an abscissa of the intersection point of the first linear segment and the second linear segment is used as a critical traffic density, and an abscissa of an intersection point of the second linear segment and the horizontal axis is used as a traffic jam density;

determine, as the target traffic state, a point, in the first linear segment and the second linear segment that conform to the constraint relationships, whose ordinate is the target traffic capacity and which is connected to an origin of the coordinate system to form a line with a slope that is the target vehicle speed; and use an abscissa of the target traffic state as the target traffic density that the target traffic state has in the target traffic flow macroscopic fundamental diagram.

Figure 9:
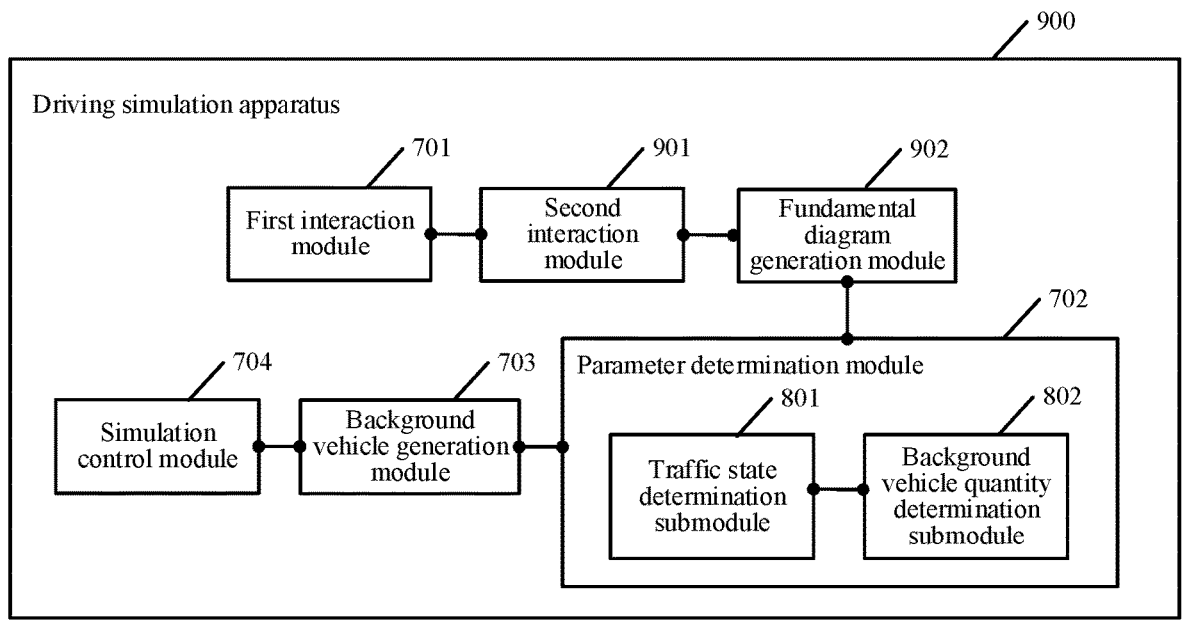
FIG. 9 is a schematic structural diagram of a driving simulation apparatus according to an embodiment of this application.

In some embodiments, on the basis of the driving simulation apparatus shown in FIG. 8, FIG. 9 is a schematic structural diagram of another driving simulation apparatus 900 according to an embodiment of this application. The apparatus further includes a second interaction module 901 configured to display a second configuration interface, and receive traffic flow quantification parameters inputted through the second configuration interface, the traffic flow quantification parameters including a free-flow vehicle speed, a jam density, a critical density, and the maximum traffic capacity; a fundamental diagram generation module 902 configured to: generate, according to the free-flow vehicle speed, the critical density, and the maximum traffic capacity, a first linear segment configured for representing a free traveling state of vehicles;

generate, according to the critical density, the maximum traffic capacity, and the jam density, the second linear segment configured for representing a jammed traveling state of the vehicles; and construct the target traffic flow macroscopic fundamental diagram according to the coordinate system and the first linear segment and the second linear segment located in the coordinate system.

In some embodiments, on the basis of the driving simulation apparatus shown in FIG. 8, the target background vehicle quantity indication parameter includes a background vehicle quantity parameter used for indicating the background vehicle quantity in the target lane.

In some embodiments, on the basis of the driving simulation apparatus shown in FIG. 8, the target background vehicle quantity indication parameter includes a location range indication parameter, and the background vehicle quantity determination submodule 802 is configured to determine the background vehicle quantity in the target lane according to the location range indication parameter of the target background vehicle and the reference vehicle-to-vehicle distance.

In some embodiments, on the basis of the driving simulation apparatus shown in FIG. 8, the location range indication parameter of the target background vehicle includes a first distance parameter and a second distance parameter, the first distance parameter being configured to indicate the maximum distance between the test vehicle and a background vehicle of the test vehicle in a forward direction, and the second distance parameter being configured to indicate the maximum distance between the test vehicle and a background vehicle of the test vehicle in a reverse direction.

The background vehicle quantity determination submodule 802 is configured to: determine a ratio of the first distance parameter to the reference vehicle-to-vehicle distance, and use the ratio as the quantity of background vehicles in the target lane in front of the test vehicle; and determine a ratio of the second distance parameter to the reference vehicle-to-vehicle distance, and use the ratio as the quantity of background vehicles in the target lane in rear of the test vehicle.

In some embodiments, on the basis of the driving simulation apparatus shown in FIG. 7, the first interaction module 701 is configured to: receive parameters inputted through the configuration controls on the first configuration interface, the parameters including the reference vehicle-to-vehicle distance, the reference vehicle speed, and the background vehicle quantity in the target lane.

In some embodiments, on the basis of the driving simulation apparatus shown in FIG. 7, the background vehicle generation module 703 is configured to: determine a target background vehicle quantity of each of S target lanes, a value for S being a positive integer greater than 1; for a $j^{th}$ target lane, sequentially determine an initial location of an $i^{th}$ background vehicle in the $j^{th}$ target lane based on a location of the test vehicle, the reference vehicle-to-vehicle distance, and a random distance deviation, and sequentially determine an initial speed of the $i^{th}$ background vehicle in the $j^{th}$ target lane based on the reference vehicle speed and a random speed deviation, a value for j being a positive integer not exceeding S.

In some embodiments, on the basis of the driving simulation apparatus shown in FIG. 7, the background vehicles are classified into a leading background vehicle and a following background vehicle. The simulation control module 704 is configured to: fix a speed of the leading background vehicle, and update a speed of the following background vehicle, so that the following background vehicle follows the leading vehicle.

In some embodiments, on the basis of the driving simulation apparatus shown in FIG. 7, when the initial location of the $i^{th}$ background vehicle in the target lane is determined, the random distance deviation is a normal random variable conforming to a first normal distribution; and when the initial speed of the $i^{th}$ background vehicle in the target lane is determined, the random speed deviation is a normal random variable conforming to a second normal distribution, a value for i being in a range of 1 to N, N being a total quantity of the background vehicles.

In this application, the term "unit" or "module" refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

The foregoing driving simulation apparatus only requires a tester to input a small number of basic parameters through the first configuration interface to complete the setting of the background vehicles in the simulated traffic environment, which greatly simplifies the operations that the tester needs to perform, and improves the efficiency of building a simulated traffic environment. In addition, the apparatus further considers the random speed deviation and the random location deviation in the process of setting the background vehicles, thereby ensuring the diversity and randomness of traveling states of the set background vehicles, so that the simulated traffic environment is more realistic. In addition, during the simulation, the speed of the background vehicle at the front is fixed, and on this basis, the speed constraints on other background vehicles in the following model are implemented, thereby preventing the background vehicles from gradually pulling out of the effective test range for the test vehicle due to lack of speed constraints on the background vehicles in the simulation traffic environment. A quantity of vehicles around the test vehicle gradually decreases, which makes it impossible to effectively test the decision algorithm of the test vehicle.

An embodiment of this application further provides a device used for driving simulation. The device may be a terminal. The device according to the embodiments of this application is described below from the perspective of hardware materialization.

Figure 10:
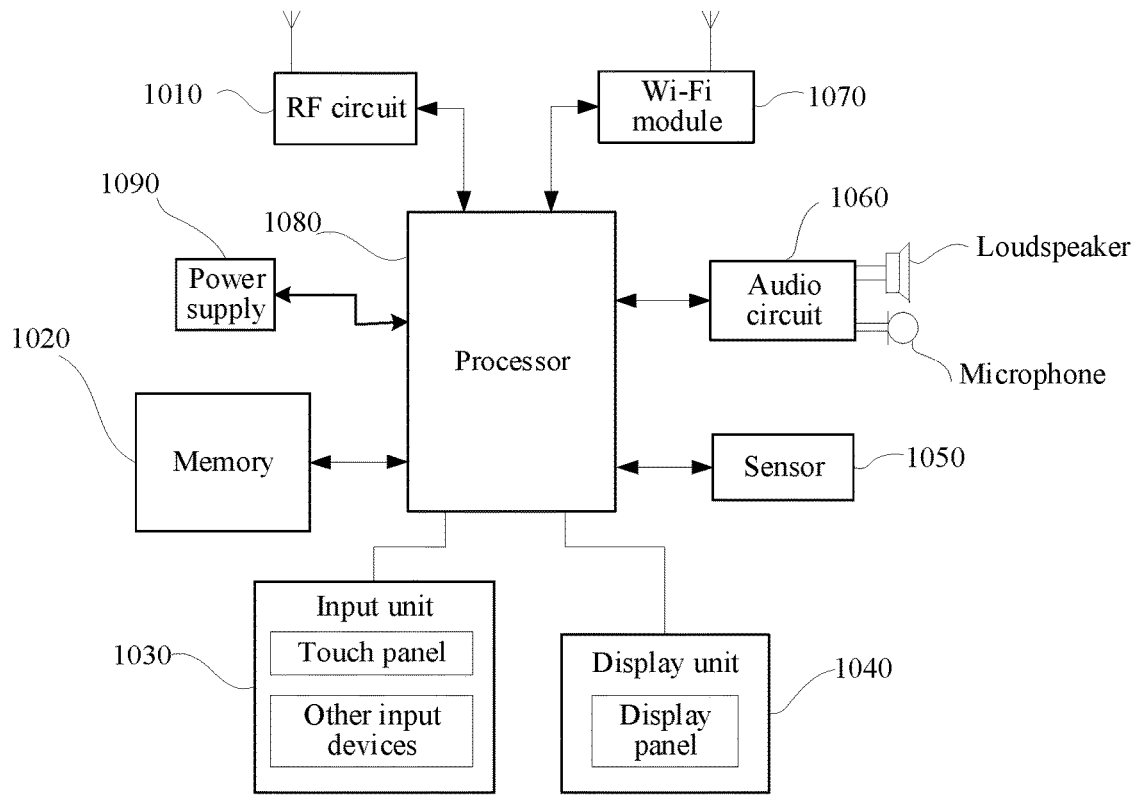
FIG. 10 is a schematic structural diagram of a terminal device according to an embodiment of this application.

An embodiment of this application further provides a device. As shown in FIG. 10, for ease of description, only parts related to the embodiments of this application are shown. For specific technical details that are not disclosed, refer to the method part in the embodiments of this application. The terminal may be any terminal device including a mobile phone, a tablet computer, a personal digital assistant (PDA), a point of sales (POS), and an on-board computer, and the terminal being a mobile phone is used as an example.

FIG. 10 is a block diagram of a structure of a part of a mobile phone related to a terminal according to an embodiment of this application. Referring to FIG. 10, the mobile phone includes components such as a radio frequency (RF) circuit 1010, a memory 1020, an input unit 1030, a display unit 1040, a sensor 1050, an audio circuit 1060, a wireless fidelity (Wi-Fi) module 1070, a processor 1080, and a power supply 1090. A person skilled in the art can understand that the structure of the mobile phone shown in FIG. 10 does not constitute a limitation to the mobile phone, and the mobile phone may include more components or fewer components than those shown in the figure, or some components may be combined, or a different component deployment may be used.

The memory 1020 may be configured to store a software program and a module. The processor 1080 runs the software program and the module that are stored in the memory 1020, so as to perform various function applications of the mobile phone and data processing. The memory 1020 may mainly include a program storage region and a data storage region. The program storage region may store an operating system, an application program (such as a sound play function or an image play function) that is required by at least one function, and the like. The data storage region may store data (such as audio data or a phonebook) that is created according to use of the mobile phone, and the like. In addition, the memory 1020 may include a high-speed random access memory, and may further include a non-volatile memory, such as at least one magnetic disk storage device, a flash memory, or another volatile solid-state storage device.

The processor 1080 is a control center of the mobile phone, and is connected to various parts of the entire mobile phone by using various interfaces and lines. By running or executing a software program and/or module stored in the memory 1020, and invoking data stored in the memory 1020, the processor 1080 executes various functions of the mobile phone and performs data processing, thereby monitoring the entire mobile phone. Optionally, the processor 1080 may include one or more processing units. The processor 1080 may integrate an application processor and a modem. The application processor mainly processes an operating system, a user interface, an application program, and the like. The modem mainly processes wireless communication. It may be understood that the modem may not be integrated into the processor 1080.

In the embodiment of this application, the processor 1080 included in the terminal further has the following functions:
  displaying a first configuration interface, and receiving parameters inputted through the first configuration interface;
  determining, based on the parameters, a reference vehicle-to-vehicle distance, a reference vehicle speed, and a background vehicle quantity of a target lane, the target lane including a lane in which a test vehicle and background vehicles are located;
  determining an initial location of each of the background vehicles in the target lane based on a location of the test vehicle, the reference vehicle-to-vehicle distance, and a random distance deviation;
  determining an initial speed of each of the background vehicles in the target lane based on the reference vehicle speed and a random speed deviation; and
  simulating traveling of each of the background vehicles in a simulated traffic environment based on the initial location and the initial speed of each of the background vehicles and the background vehicle quantity.

In some embodiments, the processor 1080 is further configured to perform steps of any one implementation of the driving simulation method provided in the embodiments of this application.

An embodiment of this application further provides a computer-readable storage medium, configured to store a computer program, the computer program being configured to perform any implementation in a driving simulation method described in the foregoing embodiments.

An embodiment of this application further provides a computer program product including instructions, the instructions, when run on a computer, causing the computer to perform any implementation in a driving simulation method described in the foregoing embodiments.

A person skilled in the art can clearly understand that for convenience and conciseness of description, for specific working processes of the foregoing described system, apparatus and unit, refer to the corresponding processes in the foregoing method embodiments, and details are not described herein.

The foregoing embodiments are merely intended for describing the technical solutions of this application, but not for limiting this application. Although this application is described in detail with reference to the foregoing embodiments, persons of ordinary skill in the art understand that they may still make modifications to the technical solutions described in the foregoing embodiments or make equivalent replacements to some technical features thereof, without departing from the spirit and scope of the technical solutions of the embodiments of this application.

INDUSTRIAL PRACTICABILITY

In the embodiments of this application, the device determines, based on the parameters inputted through the first configuration interface, the reference vehicle-to-vehicle distance, the reference vehicle speed, and the background vehicle quantity in the target lane, determines the initial location of each of the background vehicles based on the location of the test vehicle, the reference vehicle-to-vehicle distance, and the random distance deviation, determines the initial speed of each of the background vehicles in the target lane based on the reference vehicle speed and the random speed deviation, and finally simulates traveling of each of the background vehicles in the simulated traffic environment based on the initial location and the initial speed of each of the background vehicles and the background vehicle quantity. Therefore, when the user builds the simulated traffic environment according to the method, only a small number of basic parameters need to be configured at one time through the first configuration interface to complete settings of the background vehicles in the simulated traffic environment. Compared with the related art in which the background vehicles are manually set one by one in a simulated traffic environment, the method provided in the embodiment of this application can effectively reduce manual operations required during building of the simulated traffic environment, thus improving the efficiency of building the simulated traffic environment. In addition, according to the method provided in the embodiment of this application, after the reference vehicle-to-vehicle distance, the reference vehicle speed, and the target background vehicle quantity of the target lane are determined according to the basic parameters inputted by the user, the reference vehicle-to-vehicle distance and the reference vehicle speed are respectively adjusted according to the random distance deviation and the random speed deviation, so as to set the initial locations and the initial speeds of the background vehicles, thereby ensuring that the set driving states of the background vehicles are diverse and random to meet the basic requirements for traffic simulation.

What is claimed is:

1. A driving simulation method for improving an autonomous driving system configured for controlling an autonomous vehicle, performed by an electronic device, the method comprising:
receiving parameters through a first configuration interface;
determining, based on the parameters, a reference vehicle-to-vehicle distance, a reference vehicle speed, and a background vehicle quantity of a target lane, the target lane comprising a lane in which a test vehicle and background vehicles are located;
determining an initial location of each of the background vehicles in the target lane based on a location of the test vehicle, the reference vehicle-to-vehicle distance, and a random distance deviation;
determining an initial speed of each of the background vehicles in the target lane based on the reference vehicle speed and a random speed deviation; and
simulating traveling of each of the background vehicles in a simulated traffic environment based on the initial location and the initial speed of each of the background vehicles and the background vehicle quantity, further comprising:
fixing a speed of a leading background vehicle;
updating speeds of other background vehicles following the leading background vehicle according to predefined speed constraints in a following model, such that the background vehicles all stay within an effective test range of the test vehicle;
controlling the test vehicle in the simulated traffic environment to change a lane in accordance with a decision algorithm of the autonomous driving system:
in response to the test vehicle changing the lane, updating transverse speeds and locations of the background vehicles in the simulated traffic environment;
recording driving data of the test vehicle until a predefined simulation time is achieved; and
generating a test report based on the driving data of the test vehicle, wherein the test report represents performance of the autonomous driving system.

2. The method according to claim 1, wherein
the first configuration interface comprises a configuration control configured to configure a traffic state indication parameter, and a configuration control configured to configure a background vehicle quantity indication parameter;
the receiving parameters inputted through the first configuration interface comprises:
receiving a target traffic state indication parameter and a target background vehicle quantity indication parameter inputted through the configuration controls on the first configuration interface; and
the determining, based on the parameters, a reference vehicle-to-vehicle distance, a reference vehicle speed, and a background vehicle quantity of a target lane comprises:
determining the reference vehicle-to-vehicle distance and the reference vehicle speed based on a target traffic flow macroscopic fundamental diagram and the target traffic state indication parameter; and
determining the background vehicle quantity of the target lane based on the target background vehicle quantity indication parameter of the target lane.

3. The method according to claim 2, wherein the target traffic state indication parameter comprises a target traffic density; and
the determining the reference vehicle-to-vehicle distance and the reference vehicle speed based on a target traffic flow macroscopic fundamental diagram and the target traffic state indication parameter comprises:
using an inverse of the target traffic density as the reference vehicle-to-vehicle distance; and
determining a target traffic state corresponding to the target traffic density from the target traffic flow macroscopic fundamental diagram, determining a target traffic capacity that the target traffic state has in the target traffic flow macroscopic fundamental diagram, and using a ratio of the target traffic capacity to the target traffic density as the reference vehicle speed.

4. The method according to claim 3, wherein
the target traffic flow macroscopic fundamental diagram comprises a first linear segment and a second linear segment located in a coordinate system, a horizontal axis of the coordinate system representing a traffic density, a vertical axis of the coordinate system representing a traffic capacity, and each point in the first linear segment and the second linear segment representing a traffic state;

the determining a target traffic state corresponding to the target traffic density from the target traffic flow macroscopic fundamental diagram comprises:

establishing the following constraint relationships between the first linear segment and the second linear segment in the target traffic flow macroscopic fundamental diagram:

an ordinate of an intersection point of the first linear segment and the second linear segment is used as a maximum traffic capacity, an abscissa of the intersection point of the first linear segment and the second linear segment is used as a critical traffic density, and an abscissa of an intersection point of the second linear segment and the horizontal axis is used as a traffic jam density; and using, as the target traffic state, a point, in the first linear segment and the second linear segment that conform to the constraint relationships, whose abscissa is the target traffic density; and the determining a target traffic capacity that the target traffic state has in the target traffic flow macroscopic fundamental diagram comprises:

using an ordinate of the target traffic state as the target traffic capacity that the target traffic state has in the target traffic flow macroscopic fundamental diagram.

5. The method according to claim 2, wherein the target traffic state indication parameter comprises a target traffic capacity and a target vehicle speed; and the determining the reference vehicle-to-vehicle distance and the reference vehicle speed based on a target traffic flow macroscopic fundamental diagram and the target traffic state indication parameter comprises:

determining a target traffic state corresponding to the target traffic capacity and a target vehicle speed from the target traffic flow macroscopic fundamental diagram, determining a target traffic density that the target traffic state has in the target traffic flow macroscopic fundamental diagram, and using an inverse of the target traffic density as the reference vehicle-to-vehicle distance; and determining the target vehicle speed as the reference vehicle speed.

6. The method according to claim 5, wherein the target traffic flow macroscopic fundamental diagram comprises a coordinate system and a first linear segment and a second linear segment located in the coordinate system, a horizontal axis of the coordinate system representing a traffic density, a vertical axis of the coordinate system representing a traffic capacity, and each point in the first linear segment and the second linear segment representing a traffic state;

the determining a target traffic state corresponding to the target traffic capacity and a target vehicle speed from the target traffic flow macroscopic fundamental diagram comprises:

establishing the following constraint relationships between the first linear segment and the second linear segment in the target traffic flow macroscopic fundamental diagram:

an ordinate of an intersection point of the first linear segment and the second linear segment is used as a maximum traffic capacity, an abscissa of the intersection point of the first linear segment and the second linear segment is used as a critical traffic density, and an abscissa of an intersection point of the second linear segment and the horizontal axis is used as a traffic jam density; and determining, as the target traffic state, a point, in the first linear segment and the second linear segment that conform to the constraint relationships, whose ordinate is the target traffic capacity and which is connected to an origin of the coordinate system to form a line with a slope that is the target vehicle speed; and the determining a target traffic density that the target traffic state has in the target traffic flow macroscopic fundamental diagram comprises:

using an abscissa of the target traffic state as the target traffic density that the target traffic state has in the target traffic flow macroscopic fundamental diagram.

7. The method according to claim 3, further comprising:

displaying a second configuration interface, and receiving traffic flow quantification parameters inputted through the second configuration interface, the traffic flow quantification parameters comprising a free-flow vehicle speed, a jam density, a critical density, and a maximum traffic capacity;

generating, according to the free-flow vehicle speed, the critical density, and the maximum traffic capacity, the first linear segment configured for representing a free traveling state of the vehicles;

generating, according to the critical density, the maximum traffic capacity, and the jam density, the second linear segment configured for representing a jammed traveling state of the vehicles; and constructing the target traffic flow macroscopic fundamental diagram according to the coordinate system and the first linear segment and the second linear segment located in the coordinate system.

8. The method according to claim 2, wherein the target background vehicle quantity indication parameter comprises a background vehicle quantity parameter used for indicating the background vehicle quantity of the target lane.

9. The method according to claim 2, wherein the target background vehicle quantity indication parameter comprises a location range indication parameter; and the determining the background vehicle quantity of the target lane based on the target background vehicle quantity indication parameter of the target lane comprises:

determining the background vehicle quantity of the target lane according to the location range indication parameter of target background vehicles and the reference vehicle-to-vehicle distance.

10. The method according to claim 9, wherein the location range indication parameter of the target background vehicles comprises a first distance parameter and a second distance parameter, the first distance parameter being used for indicating a maximum distance between the test vehicle and a background vehicle in a forward direction of the test vehicle, and the second distance parameter being used for indicating a maximum distance between the test vehicle and a background vehicle in a reverse direction of the test vehicle; and the determining the background vehicle quantity of the target lane according to the location range indication parameter of target background vehicles and the reference vehicle-to-vehicle distance comprises:

determining a ratio of the first distance parameter to the reference vehicle-to-vehicle distance, and using the ratio as a quantity of the background vehicles in the target lane in front of the test vehicle; and determining a ratio of the second distance parameter to the reference vehicle-to-vehicle distance, and using the ratio as a quantity of the background vehicles in the target lane in rear of the test vehicle.

11. The method according to claim 1, wherein the first configuration interface comprises a configuration control configured to configure the reference vehicle-to-vehicle distance, a configuration control configured to configure the reference vehicle speed, and a configuration control configured to configure the background vehicle quantity of the target lane; and the receiving parameters inputted through the first configuration interface comprises:

receiving parameters inputted through the configuration controls on the first configuration interface, the parameters comprising the reference vehicle-to-vehicle distance, the reference vehicle speed, and the background vehicle quantity of the target lane.

12. The method according to claim 1, wherein when determining the initial location of an $i^{th}$ background vehicle in the target lane, the random distance deviation is a normal random variable conforming to a first normal distribution, and when determining the initial speed of the $i^{th}$ background vehicle in the target lane, the random speed deviation is a normal random variable conforming to a second normal distribution, a value for i being in a range of 1 to N, N being a total quantity of the background vehicles.

13. An electronic device, comprising a processor and a memory, the memory being configured to store a plurality of computer programs that, when executed by the processor, cause the electronic device to perform a driving simulation method for improving an autonomous driving system configured for controlling an autonomous vehicle, the driving simulation method including a plurality of operations including:

receiving parameters through a first configuration interface;

determining, based on the parameters, a reference vehicle-to-vehicle distance, a reference vehicle speed, and a background vehicle quantity of a target lane, the target lane comprising a lane in which a test vehicle and background vehicles are located;

determining an initial location of each of the background vehicles in the target lane based on a location of the test vehicle, the reference vehicle-to-vehicle distance, and a random distance deviation;

determining an initial speed of each of the background vehicles in the target lane based on the reference vehicle speed and a random speed deviation; and simulating traveling of each of the background vehicles in a simulated traffic environment based on the initial location and the initial speed of each of the background vehicles and the background vehicle quantity, further comprising:

fixing a speed of a leading background vehicle;

updating speeds of other background vehicles following the leading background vehicle according to predefined speed constraints in a following model, such that the background vehicles all stay within an effective test range of the test vehicle;

controlling the test vehicle in the simulated traffic environment to change a lane in accordance with a decision algorithm of the autonomous driving system;

in response to the test vehicle changing the lane, updating transverse speeds and locations of the background vehicles in the simulated traffic environment:

recording driving data of the test vehicle until a predefined simulation time is achieved; and generating a test report based on the driving data of the test vehicle, wherein the test report represents performance of the autonomous driving system.

14. The electronic device according to claim 13, wherein the first configuration interface comprises a configuration control configured to configure a traffic state indication parameter, and a configuration control configured to configure a background vehicle quantity indication parameter;

the receiving parameters inputted through the first configuration interface comprises:

receiving a target traffic state indication parameter and a target background vehicle quantity indication parameter inputted through the configuration controls on the first configuration interface; and the determining, based on the parameters, a reference vehicle-to-vehicle distance, a reference vehicle speed, and a background vehicle quantity of a target lane comprises:

determining the reference vehicle-to-vehicle distance and the reference vehicle speed based on a target traffic flow macroscopic fundamental diagram and the target traffic state indication parameter; and determining the background vehicle quantity of the target lane based on the target background vehicle quantity indication parameter of the target lane.

15. The electronic device according to claim 14, wherein the target traffic state indication parameter comprises a target traffic density; and the determining the reference vehicle-to-vehicle distance and the reference vehicle speed based on a target traffic flow macroscopic fundamental diagram and the target traffic state indication parameter comprises:

using an inverse of the target traffic density as the reference vehicle-to-vehicle distance; and determining a target traffic state corresponding to the target traffic density from the target traffic flow macroscopic fundamental diagram, determining a target traffic capacity that the target traffic state has in the target traffic flow macroscopic fundamental diagram, and using a ratio of the target traffic capacity to the target traffic density as the reference vehicle speed.

16. The electronic device according to claim 14, wherein the target traffic state indication parameter comprises a target traffic capacity and a target vehicle speed; and the determining the reference vehicle-to-vehicle distance and the reference vehicle speed based on a target traffic flow macroscopic fundamental diagram and the target traffic state indication parameter comprises:

determining a target traffic state corresponding to the target traffic capacity and a target vehicle speed from the target traffic flow macroscopic fundamental diagram, determining a target traffic density that the target traffic state has in the target traffic flow macroscopic fundamental diagram, and using an inverse of the target traffic density as the reference vehicle-to-vehicle distance; and determining the target vehicle speed as the reference vehicle speed.

17. The electronic device according to claim 13, wherein when determining the initial location of an $i^{th}$ background vehicle in the target lane, the random distance deviation is a normal random variable conforming to a first normal distribution, and when determining the initial speed of the $i^{th}$ background vehicle in the target lane, the random speed deviation is a normal random variable conforming to a second normal distribution, a value for i being in a range of 1 to N, N being a total quantity of the background vehicles.

18. A non-transitory computer-readable storage medium, storing a plurality of computer programs, the plurality of computer programs, when executed by a processor of an electronic device, cause the electronic device to perform a driving simulation method for improving an autonomous driving system configured for controlling an autonomous vehicle, the driving simulation method including a plurality of operations including:
   receiving parameters through a first configuration interface;
   determining, based on the parameters, a reference vehicle-to-vehicle distance, a reference vehicle speed, and a background vehicle quantity of a target lane, the target lane comprising a lane in which a test vehicle and background vehicles are located;
   determining an initial location of each of the background vehicles in the target lane based on a location of the test vehicle, the reference vehicle-to-vehicle distance, and a random distance deviation;
   determining an initial speed of each of the background vehicles in the target lane based on the reference vehicle speed and a random speed deviation; and
   simulating traveling of each of the background vehicles in a simulated traffic environment based on the initial location and the initial speed of each of the background vehicles and the background vehicle quantity, further comprising:
   fixing a speed of a leading background vehicle;
   updating speeds of other background vehicles following the leading background vehicle according to predefined speed constraints in a following model, such that the background vehicles all stay within an effective test range of the test vehicle;
   controlling the test vehicle in the simulated traffic environment to change a lane in accordance with a decision algorithm of the autonomous driving system;
   in response to the test vehicle changing the lane, updating transverse speeds and locations of the background vehicles in the simulated traffic environment:
   recording driving data of the test vehicle until a predefined simulation time is achieved; and
   generating a test report based on the driving data of the test vehicle, wherein the test report represents performance of the autonomous driving system.

19. The non-transitory computer-readable storage medium according to claim 18, wherein when determining the initial location of an $i^{th}$ background vehicle in the target lane, the random distance deviation is a normal random variable conforming to a first normal distribution, and when determining the initial speed of the $i^{th}$ background vehicle in the target lane, the random speed deviation is a normal random variable conforming to a second normal distribution, a value for i being in a range of 1 to N, N being a total quantity of the background vehicles.

* * * * *